(12) United States Patent
Park et al.

(10) Patent No.: US 8,653,603 B2
(45) Date of Patent: Feb. 18, 2014

(54) SEMICONDUCTOR DEVICES WITH PERIPHERAL REGION INSERTION PATTERNS

(75) Inventors: Won-Kyung Park, Seoul (KR); Satoru Yamada, Seoul (KR); Young Jin Choi, Hwaseong-si (KR); Kyo-Suk Chae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 453 days.

(21) Appl. No.: 13/028,691

(22) Filed: Feb. 16, 2011

(65) Prior Publication Data

US 2011/0198700 A1    Aug. 18, 2011

(30) Foreign Application Priority Data

Feb. 16, 2010   (KR) .................. 10-2010-0013873

(51) Int. Cl.
| | | |
|---|---|---|
| H01L 27/092 | (2006.01) | |
| H01L 21/336 | (2006.01) | |
| H01L 21/8234 | (2006.01) | |

(52) U.S. Cl.
USPC ........................................ 257/369; 438/270

(58) Field of Classification Search
CPC .. H01L 27/092; H01L 21/336; H01L 21/8234
USPC .......... 257/369, E27.062, E21.429, E21.621; 438/270
See application file for complete search history.

(56) References Cited

U.S. PATENT DOCUMENTS

| | | | |
|---|---|---|---|
| 6,867,472 B2 * | 3/2005 | Renegarajan et al. ........ 257/510 |
| 2007/0020882 A1 * | 1/2007 | Kim et al. .................... 438/427 |
| 2007/0029619 A1 | 2/2007 | Kim et al. |

FOREIGN PATENT DOCUMENTS

| | | |
|---|---|---|
| KR | 100608374 B1 | 7/2006 |
| KR | 1020070016860 A | 2/2007 |
| KR | 1020090043351 A | 5/2009 |

* cited by examiner

*Primary Examiner* — Walter H Swanson
(74) *Attorney, Agent, or Firm* — Myers Bigel Sibley & Sajovec, P.A.

(57) ABSTRACT

A semiconductor device includes a substrate including a memory cell region and a peripheral region and a field pattern including an insulating region disposed on a nitride liner in a trench in the substrate adjacent an active region. The field pattern and the active region extend in parallel through the cell and peripheral regions. The device also includes a transistor in the peripheral region including a source/drain region in the active region. The device further includes an insertion pattern including an elongate conductive region disposed in the substrate and extending along a boundary between the field pattern and the active region in the peripheral region. Fabrication methods are also described.

9 Claims, 27 Drawing Sheets

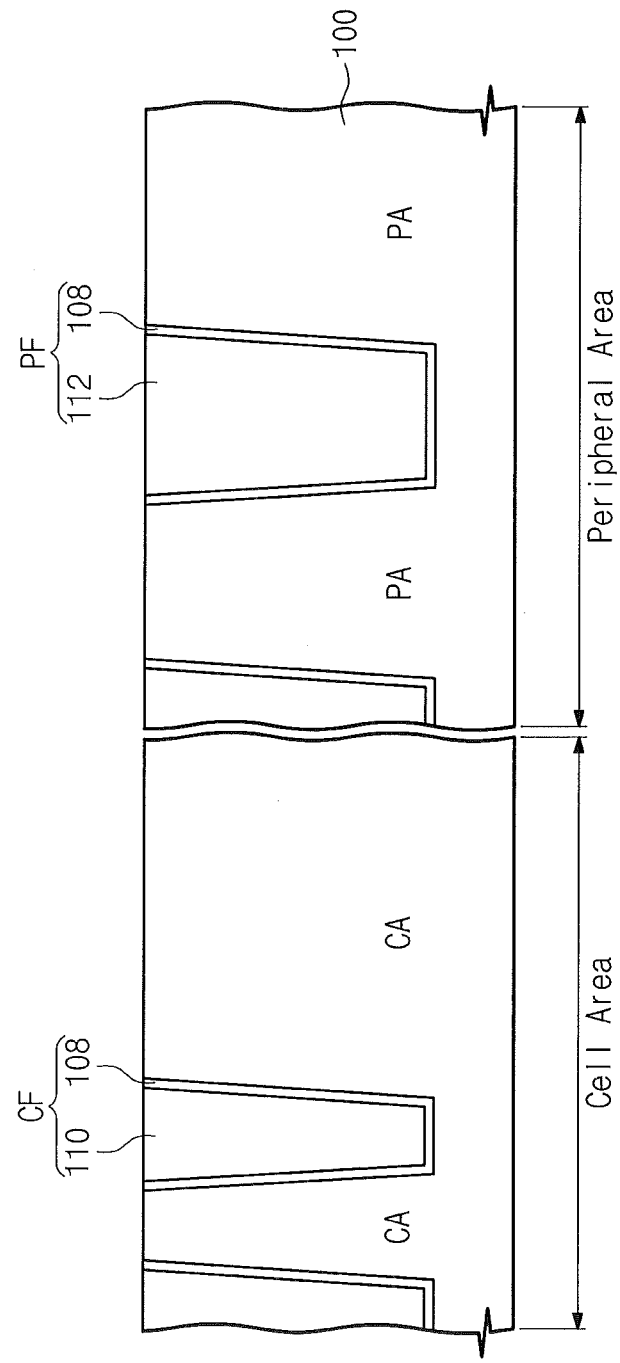

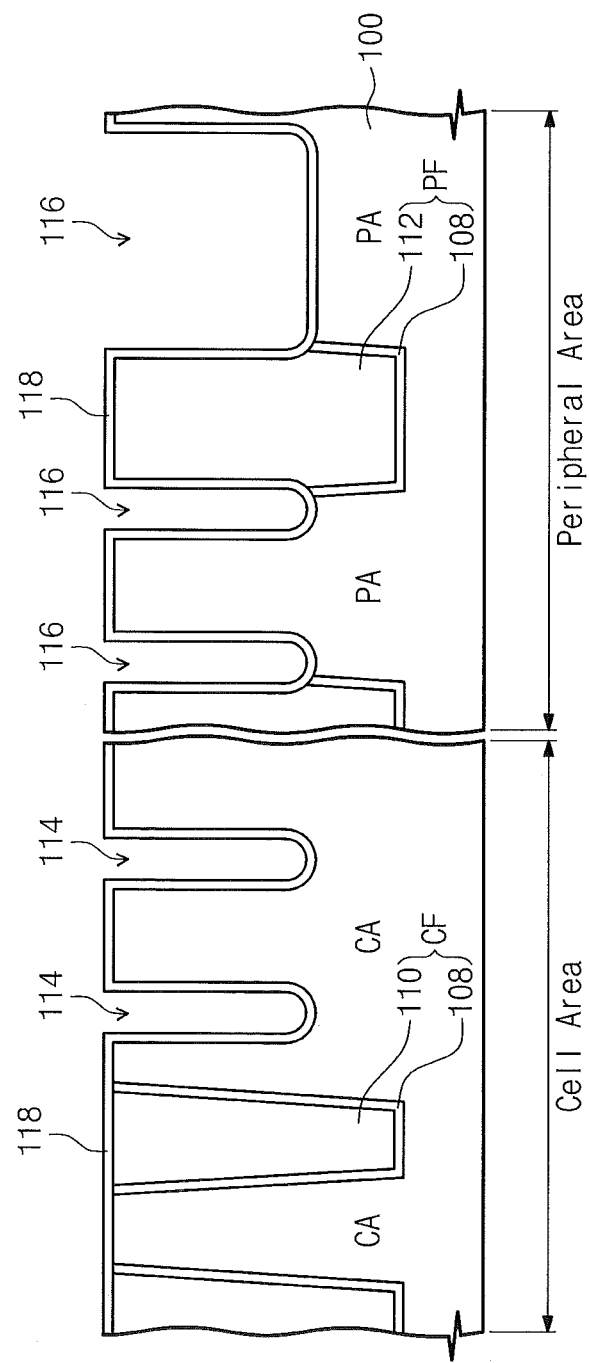

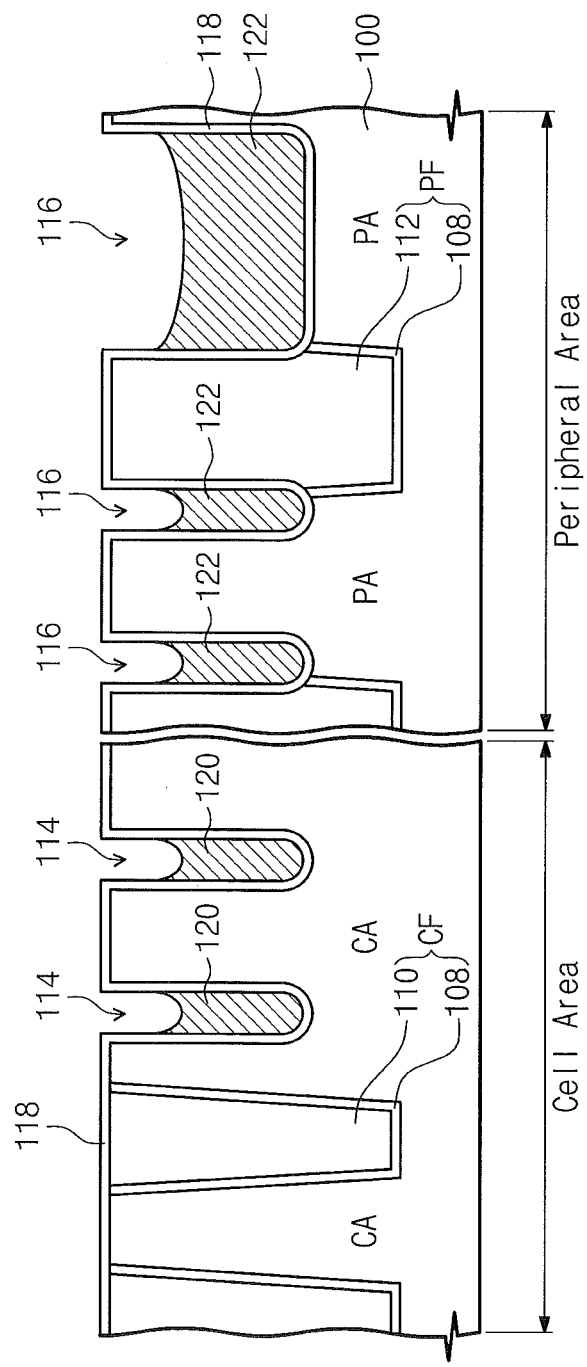

SEMICONDUCTOR DEVICES WITH PERIPHERAL REGION INSERTION PATTERNS

CROSS-REFERENCE TO RELATED APPLICATIONS

This U.S. non-provisional patent application claims priority under 35 U.S.C. §119 of Korean Patent Application 10-2010-0013873, filed on Feb. 16, 2010, the entire contents of which are hereby incorporated by reference.

BACKGROUND OF THE INVENTION

The present disclosure herein relates to semiconductor devices and methods of fabricating the same, and more particularly, to a semiconductor devices with cell and peripheral regions and methods of fabricating the same.

With increased integration, HEIP (Hot Electron Induced Punch-through) characteristics for p-MOS transistors of DRAM (Dynamic Random Access Memory) devices may deteriorate. A structure expanding a gate electrode adjacent to a field region has been proposed to address this problem. However, such a structure may cause a deterioration in reliability, operation speed and the like.

SUMMARY OF THE INVENTION

In some embodiments, a semiconductor device includes a substrate including a memory cell region and a peripheral region and a field pattern including an insulating region disposed on a nitride liner in a trench in the substrate adjacent an active region. The field pattern and the active region extend in parallel through the cell and peripheral regions. The device also includes a transistor in the peripheral region including a source/drain region in the active region. The device further includes an insertion pattern including an elongate conductive region disposed in the substrate and extending along a boundary between the field pattern and the active region in the peripheral region.

The insertion pattern may include a lower conductive portion and an upper insulating portion. The nitride liner may not extend between sidewalls of the insertion pattern and the field pattern. In some embodiments, the device further includes a first contact electrically connected to the source/drain regions of the transistor and a second contact electrically connected to the conductive region of the insertion pattern.

In some embodiments, the field pattern includes first and second field patterns including respective insulating regions disposed on nitride liners in respective trenches in the substrate and extending in parallel through the cell and peripheral regions. The active region is disposed between the first and second field patterns. The insertion pattern includes first and second insertion patterns, each including an elongate conductive region disposed in the substrate and extending along respective first and second boundaries between active region and second first and second field patterns. The transistor may include a square-ring shaped gate electrode including opposing first line patterns extending in parallel with the active pattern and overlying the first and second insertion patterns and second opposing line patterns extending across the active pattern.

Further embodiments provide a method of fabricating a semiconductor device. A field pattern is formed including an insulating region disposed on a nitride liner in a trench in a substrate adjacent an active region, the field pattern and the active region extending in parallel through cell and peripheral regions of the substrate. A transistor is formed in the peripheral region including a source/drain region in the active region. An insertion pattern is formed including an elongate conductive region disposed in the substrate and extending along a boundary between the field pattern and the active region in the peripheral region.

Further embodiments provide a method in which a plurality of first trenches are formed extending in parallel along a first direction through a cell region and a peripheral region of a substrate to define a plurality of active regions extending in parallel between the trenches. Nitride liners are formed in respective ones of the first trenches. Insulating regions are formed on respective ones of the nitride liners in the first trenches to form a plurality of field patterns extending in parallel along the first direction through the cell region and the peripheral region. Portions of the substrate, the nitride liner and the insulating regions are removed to form second trenches extending along the first direction at boundaries of the active regions in the peripheral region and third trenches extending along a second direction transverse to the first direction in the cell region through the active regions. Conductive regions are formed in bottom portions of the second and third trenches. Source/drain regions are formed in the active regions on first and second sides of the conductive regions in the third trenches. A gate electrode may be formed in the peripheral region extending along the second direction and crossing the conductive regions in the second trenches.

BRIEF DESCRIPTION OF THE DRAWINGS

The accompanying drawings are included to provide a further understanding of the inventive subject matter, and are incorporated in and constitute a part of this specification. The drawings illustrate exemplary embodiments of the inventive subject matter and, together with the description, serve to explain principles of the inventive subject matter. In the drawings.

DETAILED DESCRIPTION

Figure 1A:
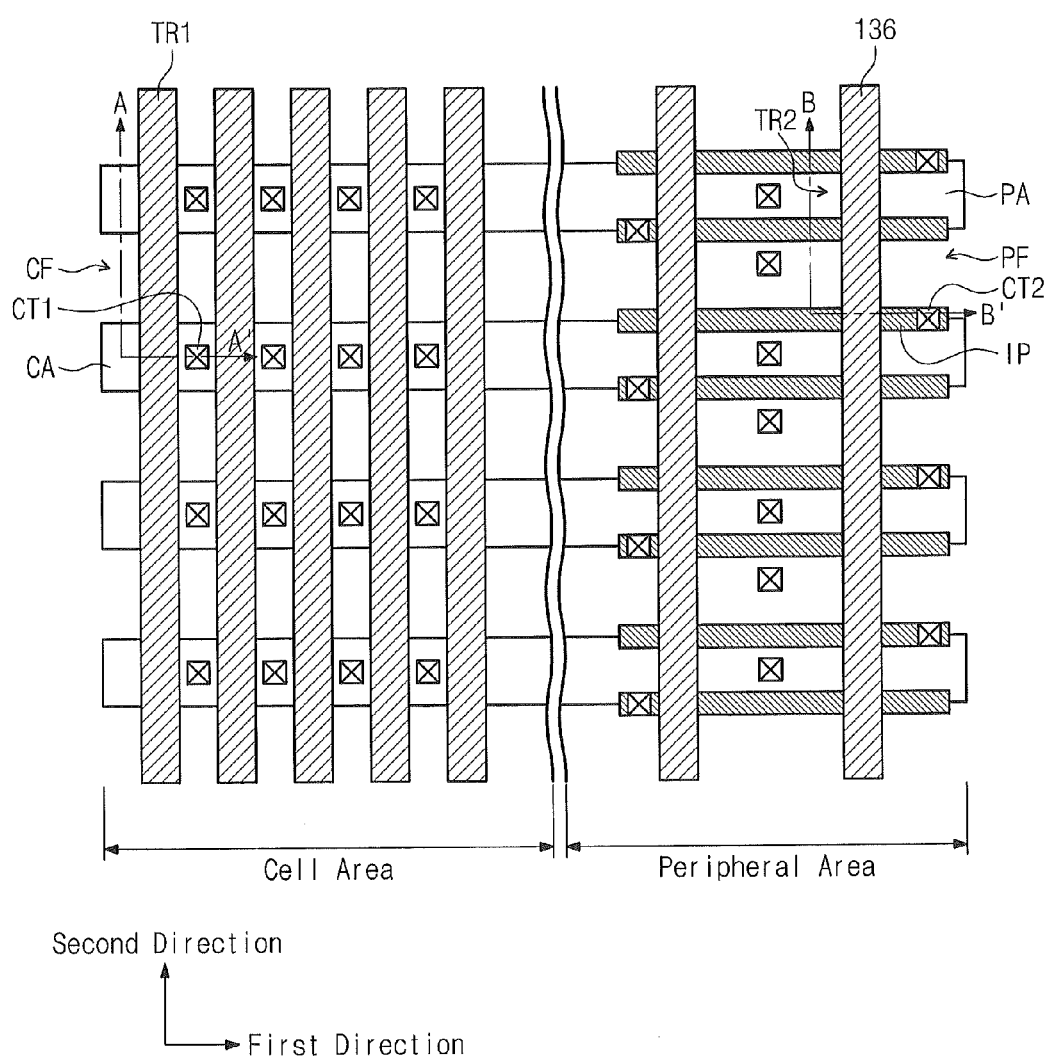
FIG. 1A is a plan view illustrating a semiconductor device according to some embodiments of the inventive subject matter.

Goals, other goals, features, and advantages of the present inventive subject matter may be understood more readily by reference to the following detailed description of preferred embodiments and the accompanying drawings. The exemplary embodiments of the inventive subject matter may, however, be embodied in many different forms and should not be construed as being limited to the embodiments set forth herein. Rather, these embodiments are provided so that this disclosure will be thorough and complete and will fully convey the scope of the inventive subject matter to those skilled in the art, and the embodiments of the inventive subject matter will only be defined by the appended claims.

It will be understood that when any element is referred to as being "on" another element, it may be directly on another element or a third element may be interposed therebetween. In drawings, the thickness of elements is exaggerated to effectively describe technical details.

Example embodiments are described herein with reference to cross-sectional illustrations and/or plane illustrations that are schematic illustrations of idealized embodiments of example embodiments. In drawings, the thickness of layers and regions is exaggerated to effectively describe technical details. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments. It will be understood that, although the terms first, second, etc. are used herein to describe various elements, these elements should not be limited by these terms. These terms are used to distinguish one element from another. The embodiments described herein include complementary embodiments. As used herein, the singular forms are intended to include the plural forms as well, unless the context clearly indicates otherwise.

The terminology used herein is for the purpose of describing various embodiments only and is not intended to be limiting of example embodiments. It will be further understood that the terms "comprises" and/or "comprising," when used in this specification, specify the presence of elements, but do not preclude the presence or addition of one or more elements.

The present disclosure is to provide a semiconductor device suppressing deterioration in the characteristics of HEIP without expanding a gate electrode.

The present disclosure is also to provide a method of fabricating the semiconductor device.

Embodiments of the inventive subject matter provide a semiconductor device including: a field pattern defining an active pattern extending in one direction in a substrate and including a device isolating pattern and a nitride liner; a first insertion pattern being recessed downwardly from a surface of the substrate in a boundary region between the active pattern and the field pattern and extending in the extension direction of the active pattern; and a first transistor disposed on the substrate. One side of the first insertion pattern may come into contact with the device isolating pattern and the other side of the first insertion pattern may come into contact with the active pattern.

In some embodiments, the first insertion pattern may include: a lower portion containing a conductive material; and an upper portion containing an oxide.

In other embodiments, no nitride liner may be formed in the field pattern in which the first insertion pattern is formed.

In still other embodiments, the semiconductor device may further include a first contact electrically connected to the first transistor; and a second contact electrically connected to the lower portion of the insertion pattern.

In even other embodiments, the first transistor may include a gate electrode extending in a direction different from the extension direction of the active pattern.

In yet other embodiments, the first transistor may include a gate electrode with a square ring shape in which first line patterns face each other and second line patterns face each other. The first line patterns may extend in the same direction as the extension direction of the active pattern, and the second line patterns extend in a direction different from the extension direction of the active pattern. The second line patterns may have an extension length longer than that of the first line patterns.

In further embodiments, the semiconductor device may further include a second insertion pattern extending in the same direction as the extension direction of the active pattern and being formed through the active pattern.

In still further embodiments, the second insertion pattern may include a lower portion containing a conductive material and an upper portion containing an oxide.

In even further embodiments, the semiconductor device may further include a contact electrically connected to the lower portion of the second insertion pattern.

In yet further embodiments, the substrate may include a cell area and a peripheral area. The first insertion pattern and the first transistor are formed in the peripheral area. The first transistor may be a p-MOS transistor.

In yet further embodiments, the substrate may include a second transistor being formed in the cell area, extending in a direction different from the extension direction of the active pattern, and including a buried channel. The second transistor may be an n-MOS transistor.

Embodiments of the inventive subject matter also provide a method of fabricating a semiconductor device including: forming a field pattern including a device isolating pattern and a nitride liner in a substrate so as to define an active pattern extending in one direction; forming a recess extending in the extension direction of the active pattern in a boundary region between the active pattern and the field pattern; forming a first insertion pattern by burring the inside of the recess; and forming a first transistor on the substrate. One side of the first insertion pattern may come into contact with the device isolating pattern and the other side of the first insertion pattern may come into contact with the active pattern.

In some embodiments, the recess may be formed by etching the boundary region between the active pattern and the field pattern to remove a part of the nitride liner of the field pattern.

In other embodiments, the forming of the first insertion pattern may include: forming a lower portion of the first insertion pattern containing a conductive material in a lower portion of the recess; and forming an upper portion of the first insertion pattern containing an oxide in an upper portion of the recess.

In still other embodiments, the method may further include forming a first contact electrically connected to the first transistor; and forming a second contact electrically connected to the lower portion of the first insertion pattern.

In even other embodiments, the upper portion of the first insertion pattern may be formed so as to cover an upper surface of the substrate.

In yet other embodiments, the forming of the first transistor may include: forming a gate electrode extending in a direction different from the extension direction of the active pattern in the upper portion of the first insertion pattern; and forming a source/drain region by implanting impurities into the active pattern adjacent to both sides of the gate electrode.

In further embodiments, the forming of the first transistor may include: forming a gate electrode with a square ring shape, in which first line patterns face each other and second line patterns face each other, on the upper portion of the first insertion pattern; and forming a source/drain region by implanting impurities into the active pattern adjacent to both sides of the gate electrode. The first line patterns may extend in the same direction as the extension direction of the active pattern, the second line patterns may extend in a direction different from the extension direction of the active pattern, and the second line patterns may have an extension length longer than that of the first line patterns.

In still further embodiments, the method may further include forming a second insertion pattern extending in the same direction as the extension direction of the active pattern and being formed through the active pattern; and forming a contact electrically connected to a lower portion of the second insertion pattern In even further embodiments, the method may further include forming a contact electrically connected to the lower portion of the second insertion portion.

In yet further embodiments, the substrate may include a cell area and a peripheral area. The first insertion pattern and the first transistor may be formed in the peripheral area. The first transistor may be a p-MOS transistor. The method may further include forming a second transistor extending in an extension direction different from the extension direction of the active pattern in the cell area and including a buried channel. The second transistor may be an n-MOS transistor.

Hereinafter, exemplary embodiments of the inventive subject matter will be described in detail with reference to the accompanying drawings.

First Embodiments

Figure 1B:
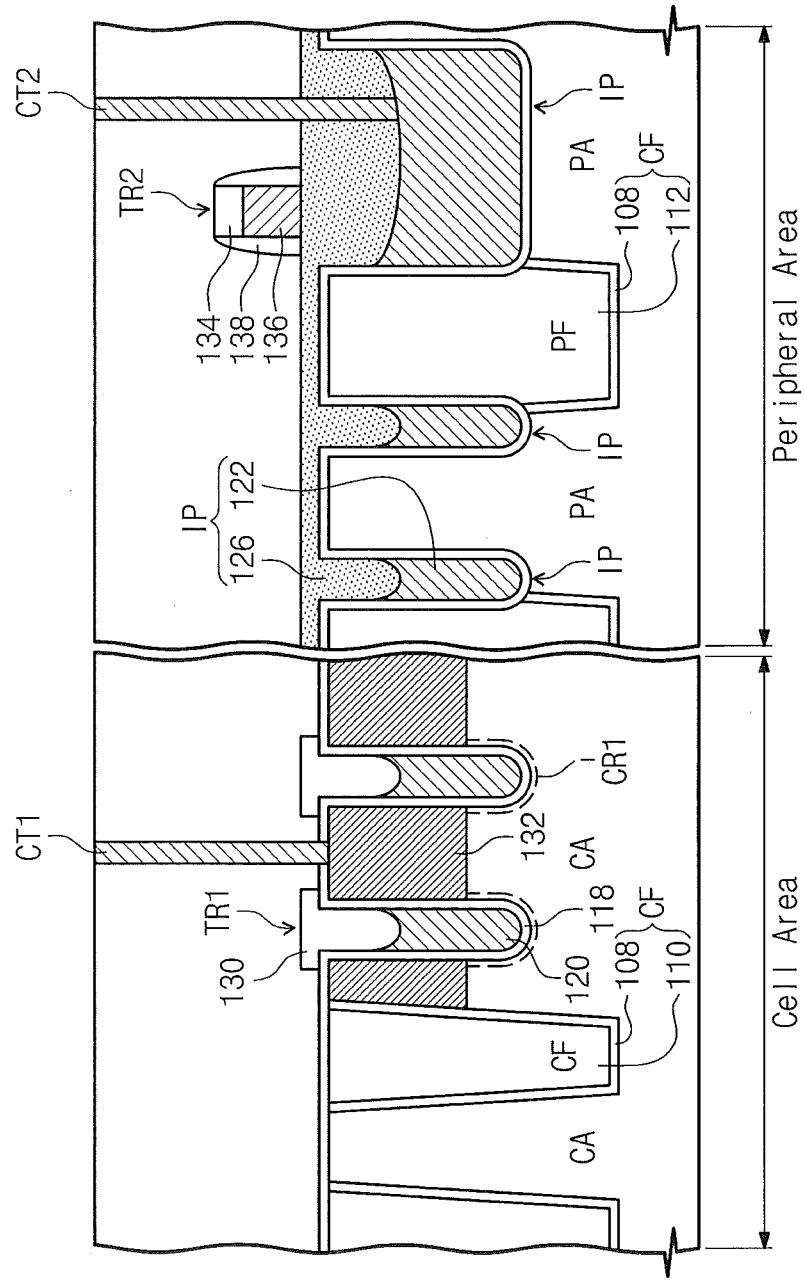
FIGS. 1B through 1D are cross-sectional views taken along the lines A-A' and B-B' of FIG. 1A.
Figure 1C:
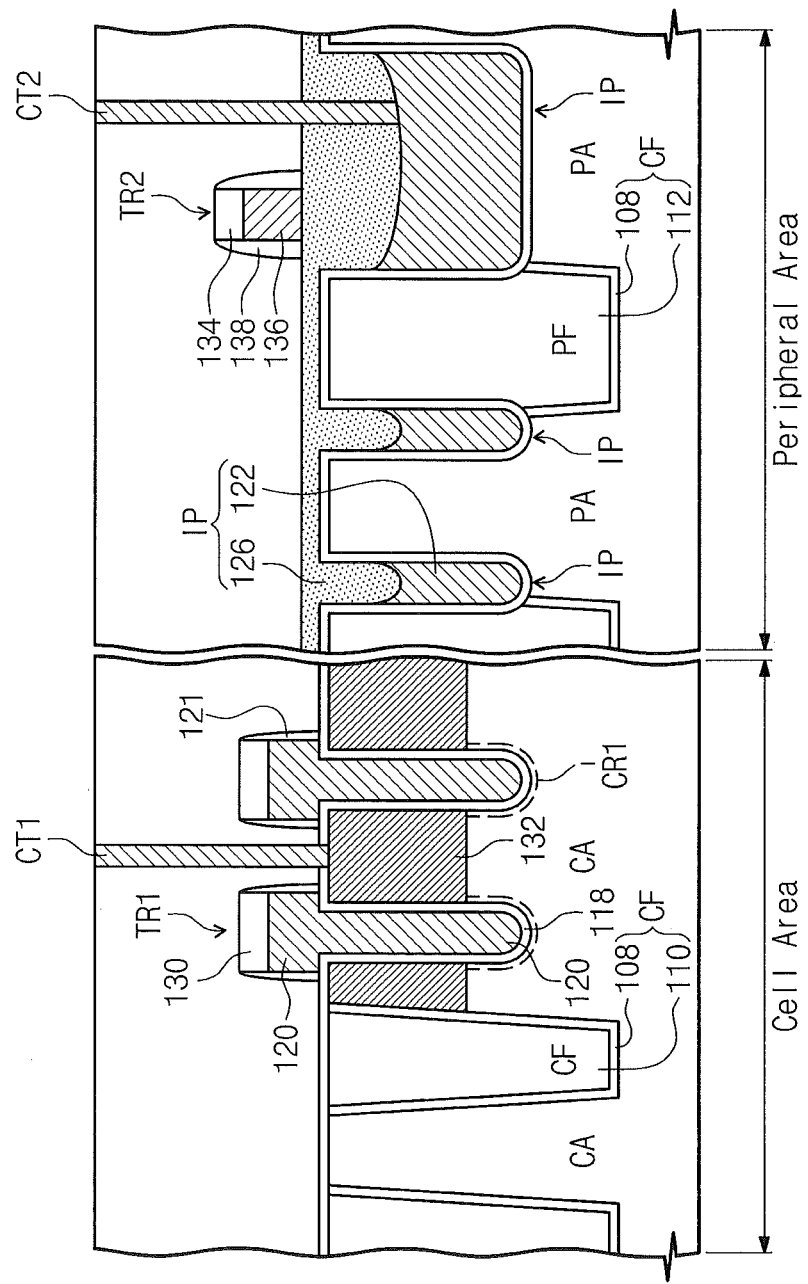
Figure 1D:
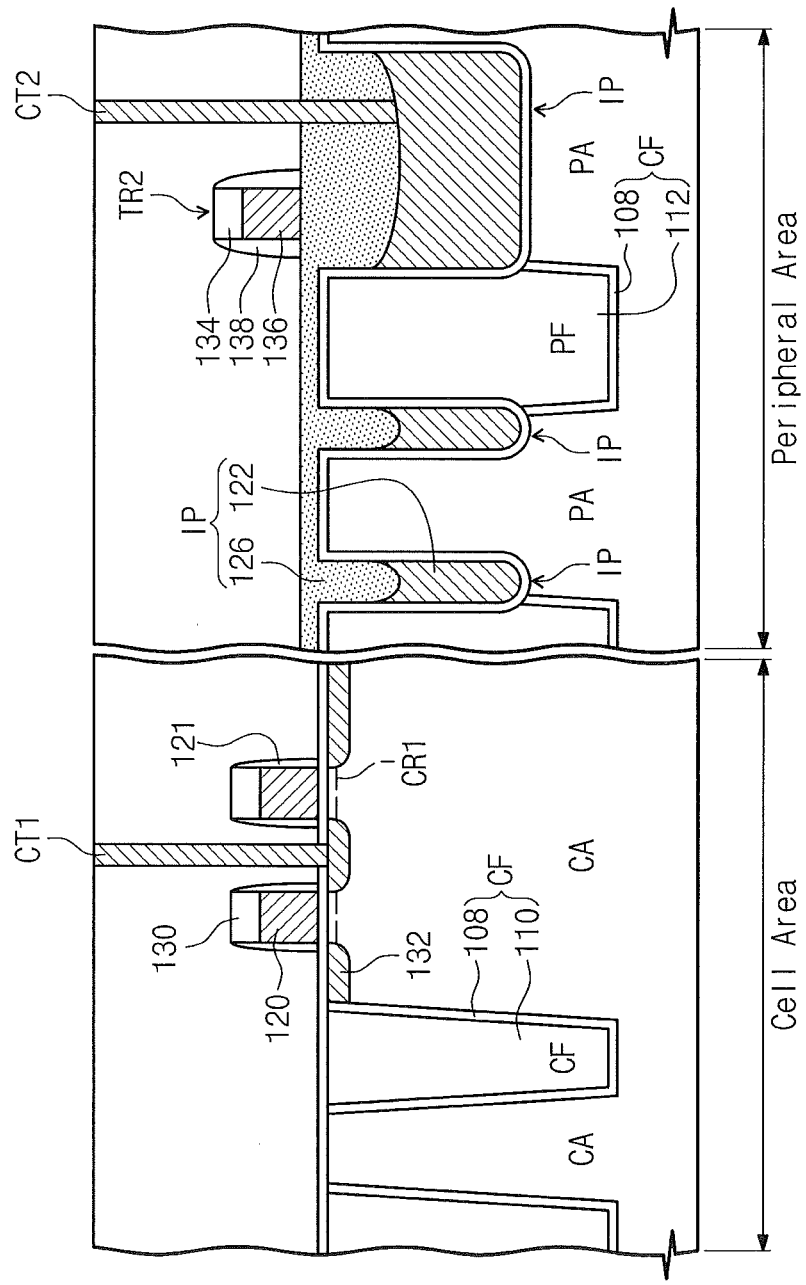

FIG. 1A is a plan view illustrating a semiconductor device according to some embodiments of the inventive subject matter. FIGS. 1B through 1D are cross-sectional views taken along the lines A-A' and B-B' of FIG. 1A. The left parts of FIGS. 1B through 1D are the cross-sectional views illustrating the semiconductor device taken along the line A-A' of FIG. 1A. The right parts of FIGS. 1B through 1D are the cross-sectional views illustrating the semiconductor device taken along the line B-B' of FIG. 1A.

Referring to FIGS. 1A through 1D, the semiconductor device may include field patterns CF and PF, active patterns CA and PA, a first transistor TR1, a second transistor TR2, an insertion pattern IP, a first contact CT1, and a second contact CT2 formed in a substrate 100.

Examples of the substrate 100 include a semiconductor substrate such as a silicon (Si) substrate, a germanium (Ge) substrate, or a silicon-germanium (Si—Ge) substrate, an SOI (silicon-on-insulator) substrate, a GOI (germanium-on-insulator) substrate, and an SGOI (silicon-germanium-on-insulator) substrate.

The substrate 100 may include a cell area and a peripheral area. The cell area may include a cell active pattern CA and a cell field pattern CF. The peripheral area may include a peripheral cell area PA and a peripheral field pattern PF.

The field patterns CF and PF may define the active patterns CA and PA. According to some embodiments of the inventive subject matter, the active patterns CA and PA may be generally linear and extend along a first direction.

The field patterns CF and PF may have a structure buried downwardly from the upper surface of the substrate 100. The upper surfaces of the field patterns CF and PF have substantially the same level as that of the upper surface of the substrate 100. The field patterns CF and PF may include a nitride liner 108 and device isolating patterns 110 and 112, respectively. For example, the nitride liner 108 may partially surround each of the device isolating patterns 110 and 112.

The first transistor TR1 may be formed in the cell area. According to some embodiments of the inventive subject matter, the first transistor TR1 may be an n-MOS transistor.

The first transistor TR1 may include a first gate insulating layer 118, a first gate electrode 120, a nitride pattern 130, and a first source/drain region 132. The first gate electrode 120 may be generally linear and extend along a second direction different from the first direction. For example, the second direction may be perpendicular to the first direction.

Referring to FIG. 1B according to some embodiments of the inventive subject matter, the first gate electrode 120 of the first transistor TR1 may be buried downwardly so as to be distant from the surface of the substrate 100. In this case, the first transistor TR1 may further include a first buried channel region CR1.

Referring to FIG. 1C according to further embodiments of the inventive subject matter, the first gate electrode 120 of the first transistor TR1 may include a lower portion recessed downwardly from the surface of the substrate 100 and an upper portion protruding from the surface of the substrate 100. In this case, the first transistor TR1 may further include the first buried channel region CR1. A first spacer 121 may further be formed on the upper sidewall of the first gate electrode 120.

The first gate electrode 120 in FIG. 1C may be formed together with a lower portion of the insertion pattern IP. More specifically, a conductive layer is formed on the substrate 100 up to the height of the first gate electrode 120, and then the conductive layer of the peripheral area is selectively etched up to the height of the lower portion of the insertion pattern IP. The conductive pattern of the cell area is patterned to form the first gate electrode 120.

Referring to FIG. 1D according to further embodiments of the inventive subject matter, the first gate electrode 120 of the first transistor TR1 may be formed on the surface of the substrate 100. In this case, the first transistor TR1 may further include the first channel region CR1 formed on the first substrate 100. The first spacer 121 may further be formed on the sidewall of the first gate electrode 120. The first gate electrode 120 may be formed together with a second gate electrode 136 of the second transistor TR2.

The second transistor TR2 may include a second gate insulating layer 126, the second gate electrode 136, and a second source/drain region (not illustrated).

According to some embodiments of the inventive subject matter, a part of an upper portion 126 of the insertion pattern IP may function as the second gate insulating layer 126, which is described in more detail below. The second gate electrode 136 may be generally linear and extend in the second direction. In this case, the second transistor TR2 may further include a second channel region (not illustrated) formed on the surface of the substrate 100.

The insertion pattern IP may be formed in the peripheral area. More specifically, the insertion pattern IP may be formed in the boundary region between the peripheral active pattern PA and the peripheral field pattern PF. The insertion pattern IP may be generally linear and extend in the first direction. The insertion pattern IP may have a structure recessed downwardly from the surface of the substrate 100. First and second sides of the insertion pattern IP may come into contact with the device isolating pattern of the peripheral field pattern PF and the peripheral active pattern PA, respectively. The nitride liner 108 may not be formed near the region where the insertion pattern IP is formed.

The insertion pattern IP may include a lower portion 122 containing a conductive material and an upper portion 126 containing an oxide. An example of the oxide includes a silicon oxide. Examples of the conductive material include silicon, metal, and metal compound.

By forming no nitride liner 118 in the boundary region between the peripheral active pattern PA and the peripheral field pattern PF where the insertion pattern IP is formed, it is possible to reduce deterioration in HEIP characteristics in the p-MOS transistor. A detailed description of potential performance is provided below with reference to FIGS. 6A and 6B.

The first contact CT1 may be electrically connected to the first or second source/drain region 132. The first contact CT1 may electrically connect the first or second source/drain region 132 to a bit line (not illustrated) or a capacitor (not illustrated).

The size of the first contact CT1 may be expanded. For example, the size of the first contact CT1 may be expanded in the second direction. More specifically, a conventional semiconductor device may have an expanded gate electrode structure such as a tap structure to suppress the deterioration in the characteristics of HEIP. According to some embodiments of the inventive subject matter, however, the semiconductor device does not require an expanded gate electrode structure by removing the nitride liner. Accordingly, the first contact CT1 may have a size substantially greater than that of a conventional semiconductor device. With such a configuration, the electric contact area of the first contact CT1 is increased, thereby potentially improving the electric reliability of the semiconductor device.

The second contact CT2 may be electrically connected to the lower portion of the insertion pattern IP. By applying a voltage of an appropriate range to the second contact CT2 depending on the conductive material contained in the lower portion 122 of the insertion pattern IP, it is possible to improve the characteristics of the semiconductor device including the insertion pattern IP.

Hereinafter, operations for fabricating semiconductor devices illustrated in FIGS. 1A and 1B will be described.

Figure 2A:
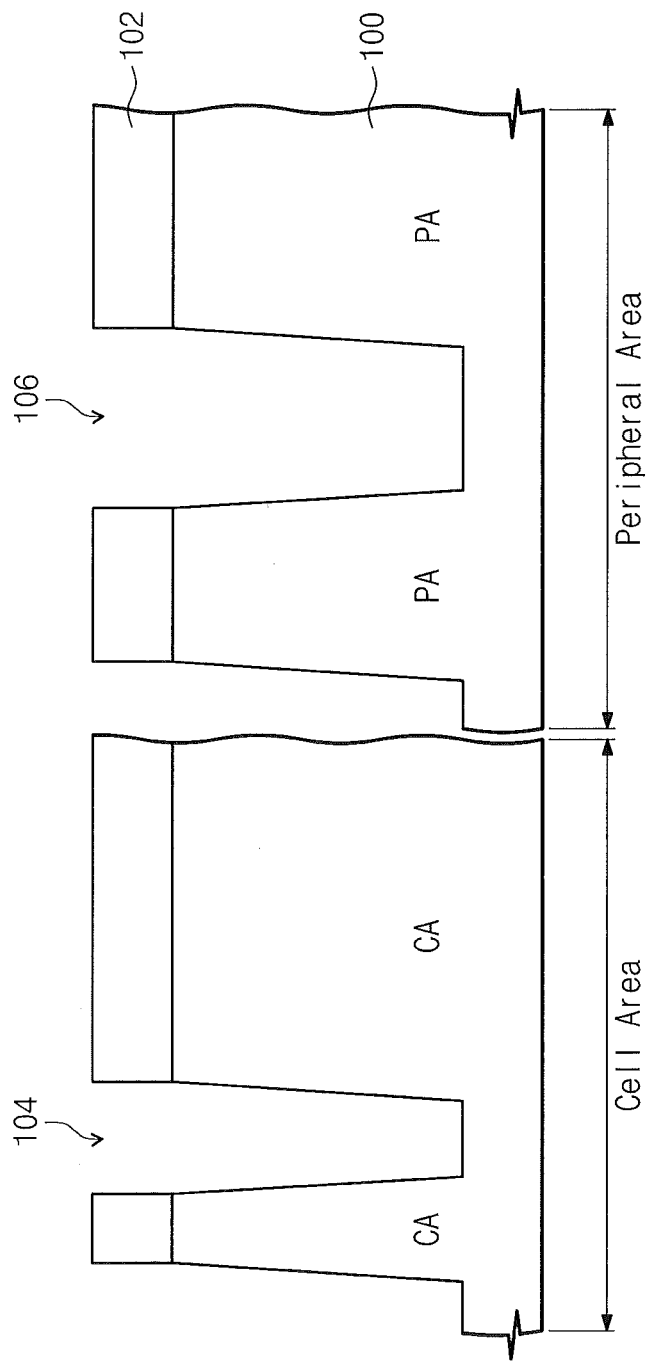
FIGS. 2A through 2N are cross-sectional views illustrating a method of fabricating the semiconductor device according to some embodiments of the inventive subject matter.
Figure 2B:
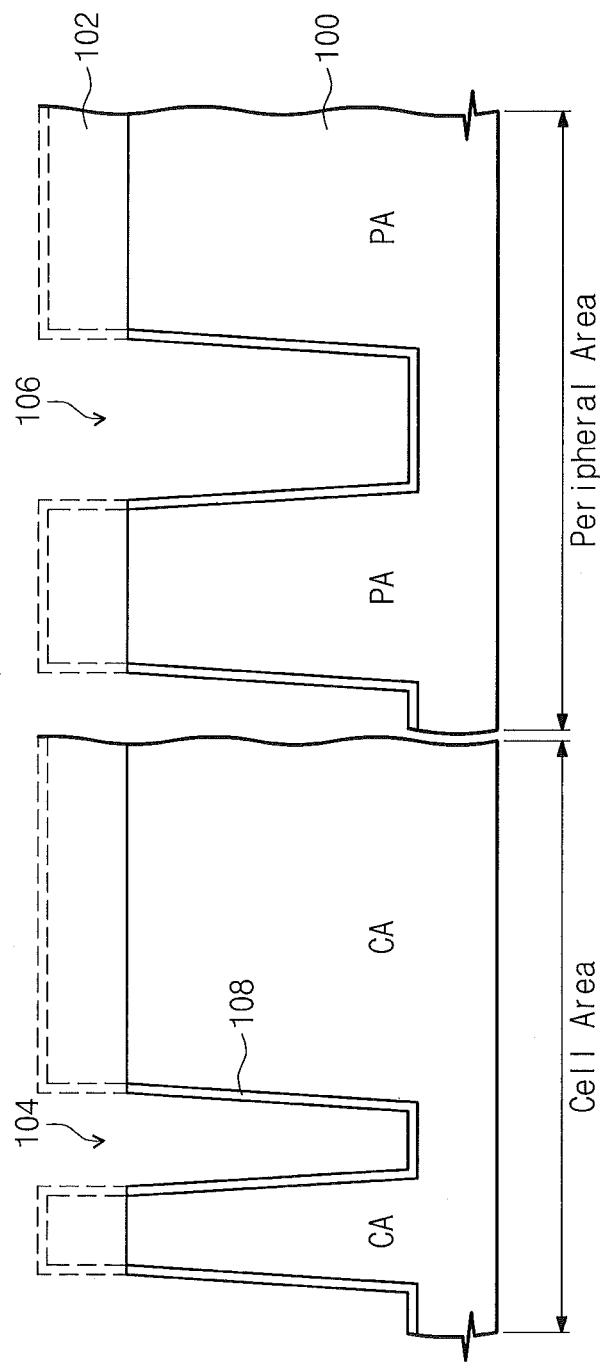
Figure 2D:
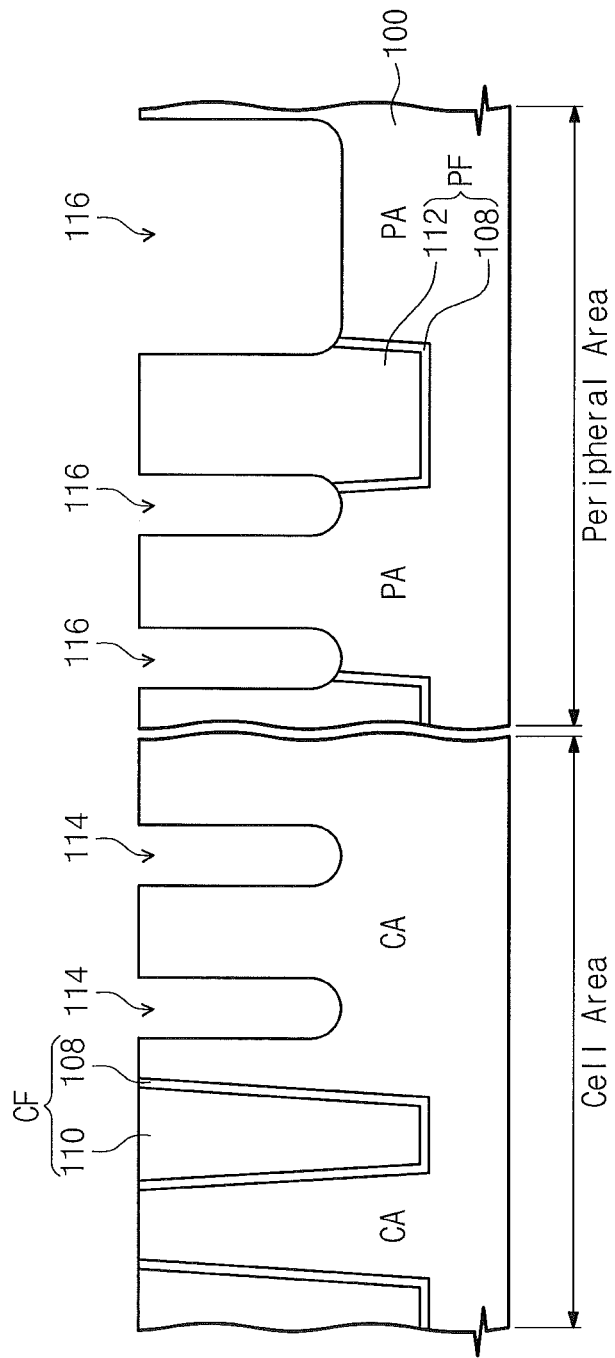
Figure 2G:
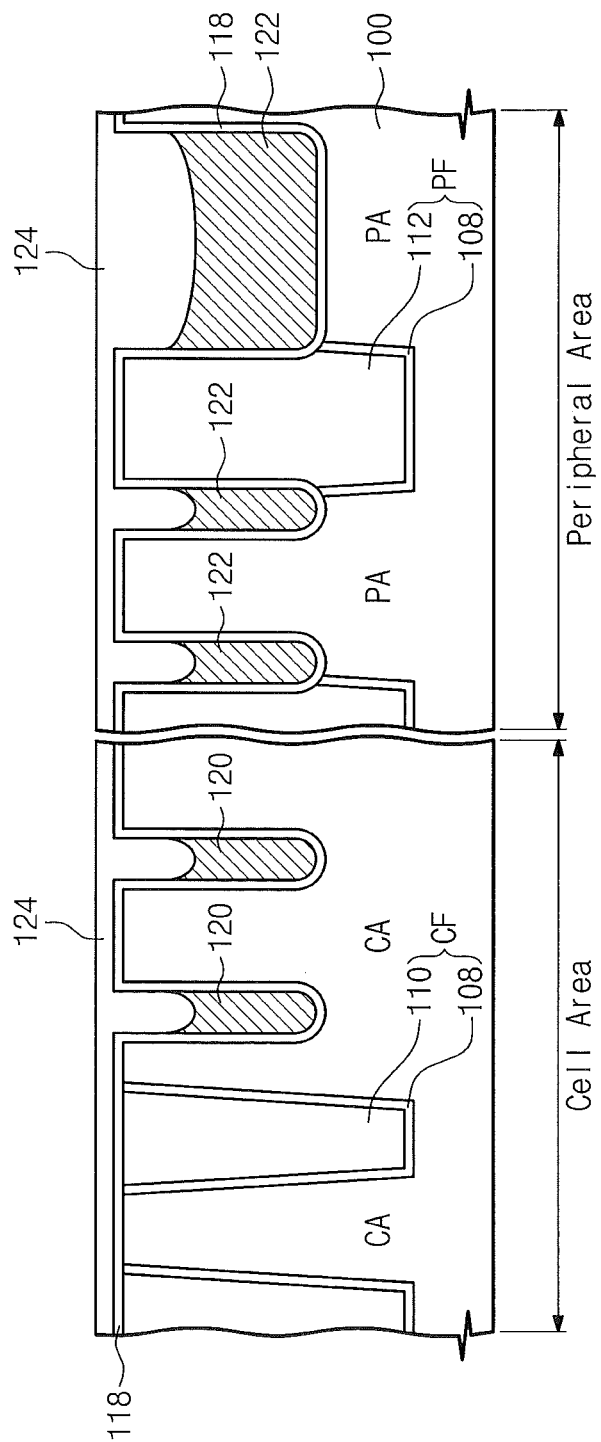
Figure 2H:
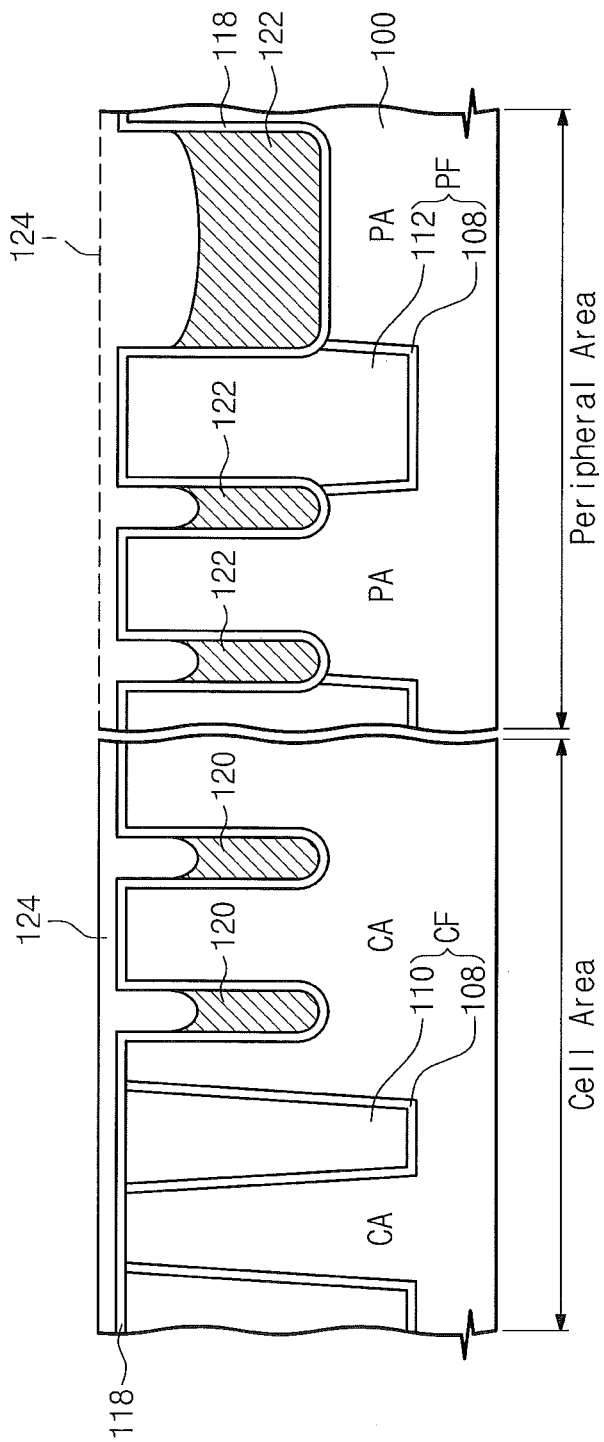
Figure 2I:
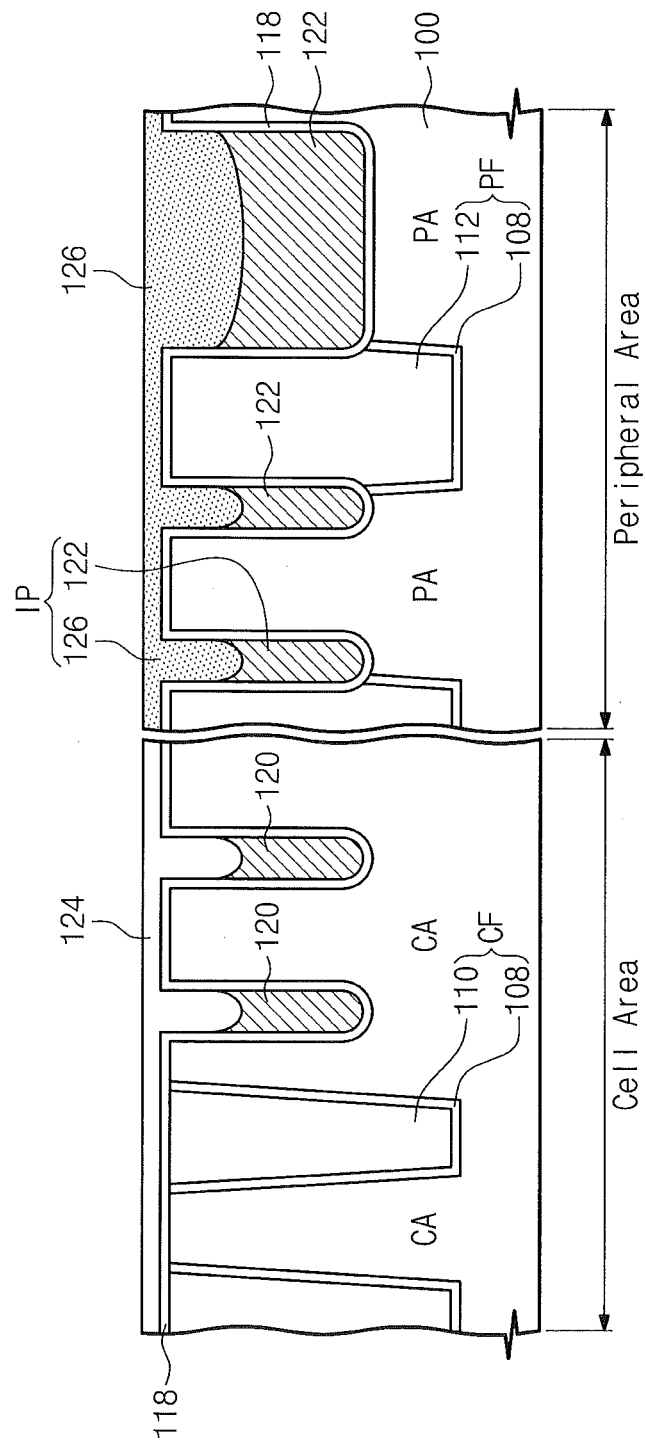
Figure 2J:
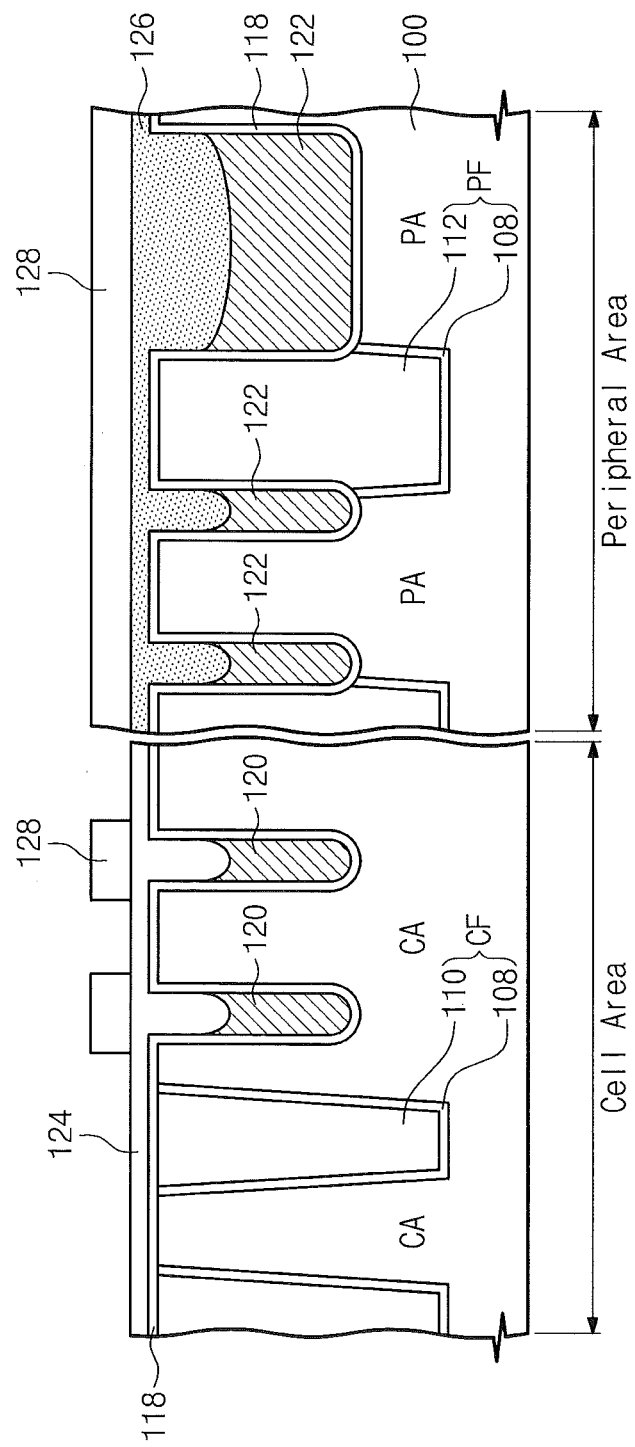
Figure 2K:
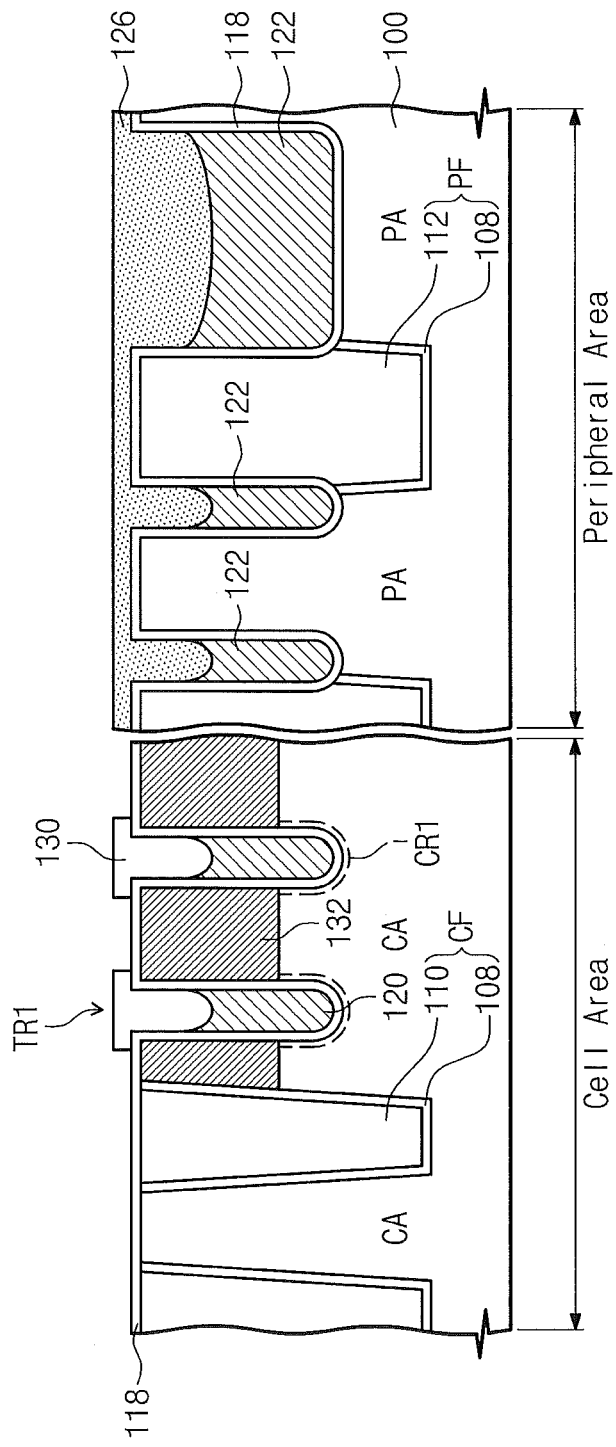
Figure 2L:
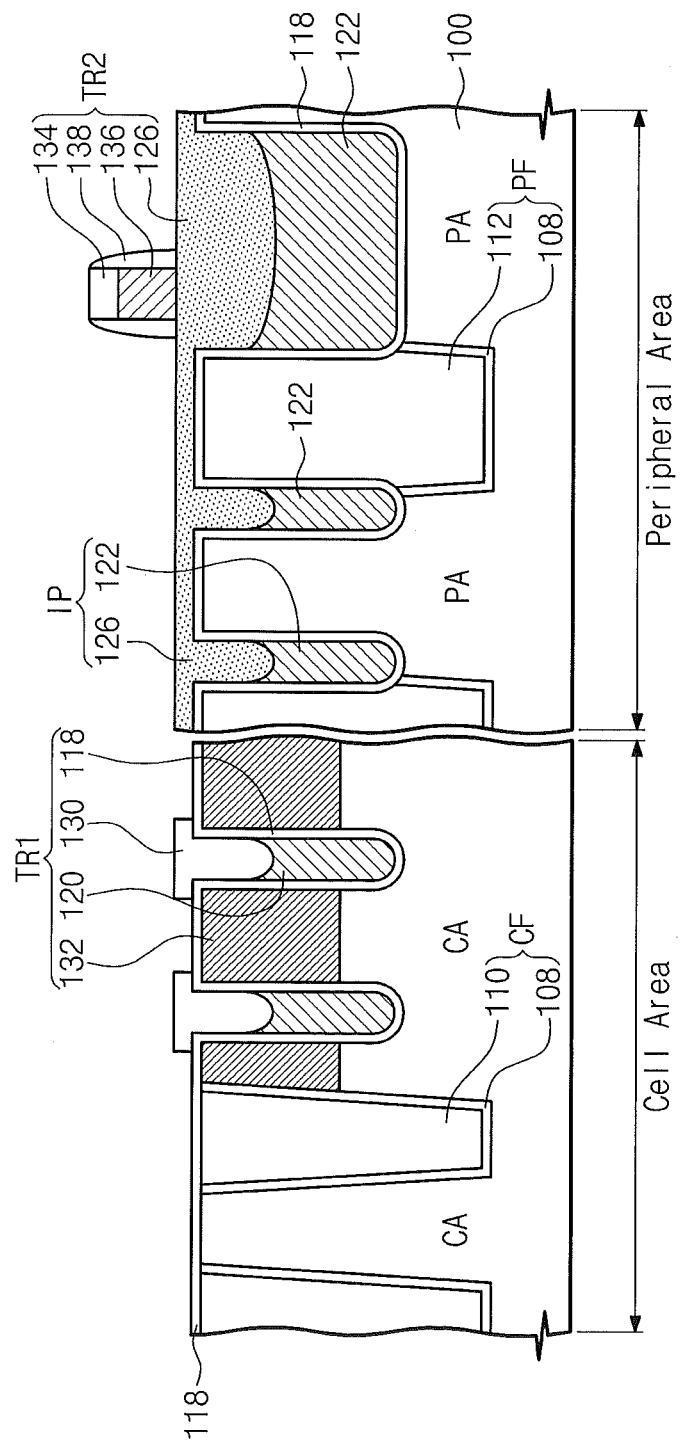
Figure 2M:
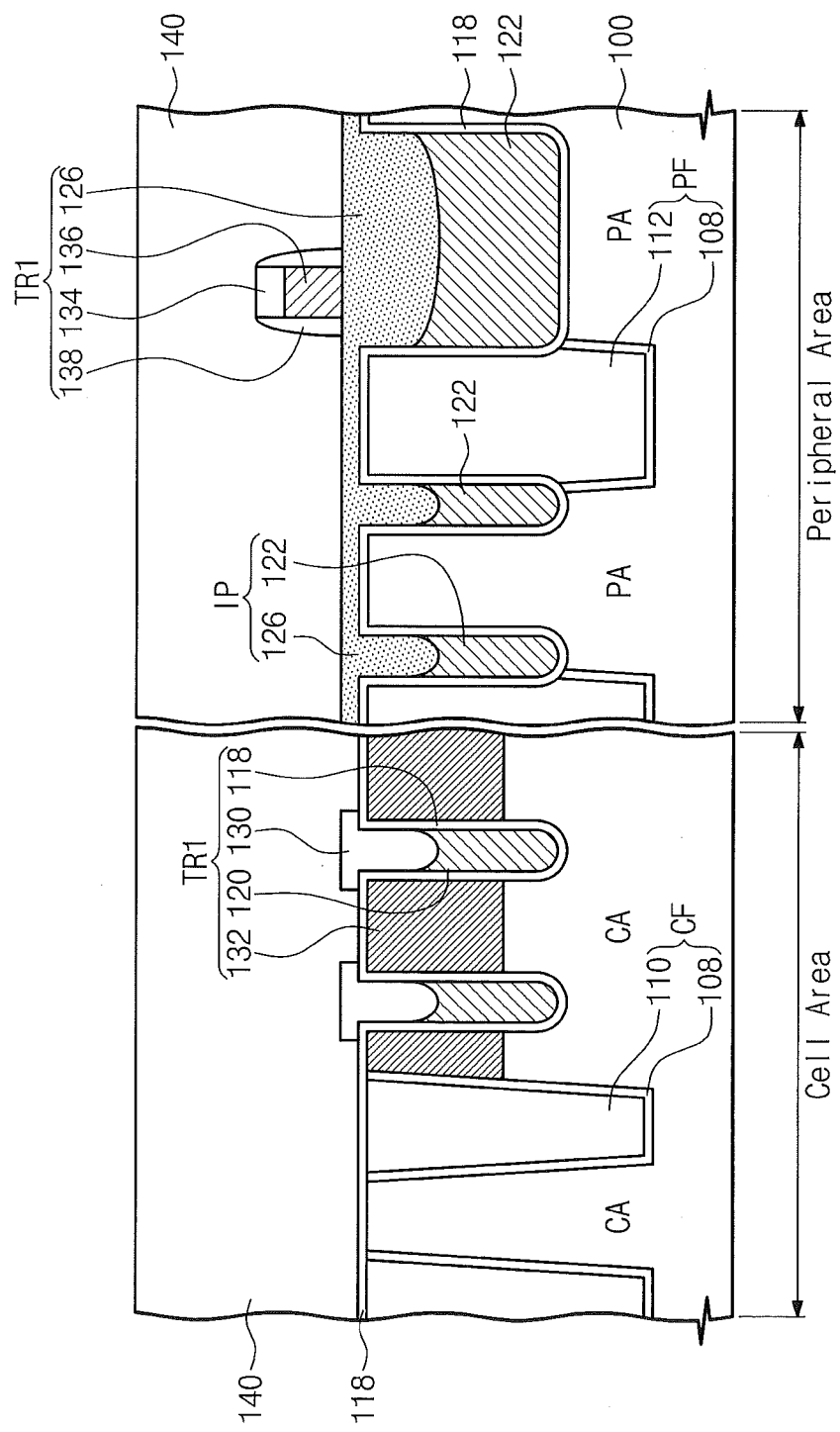
Figure 2N:
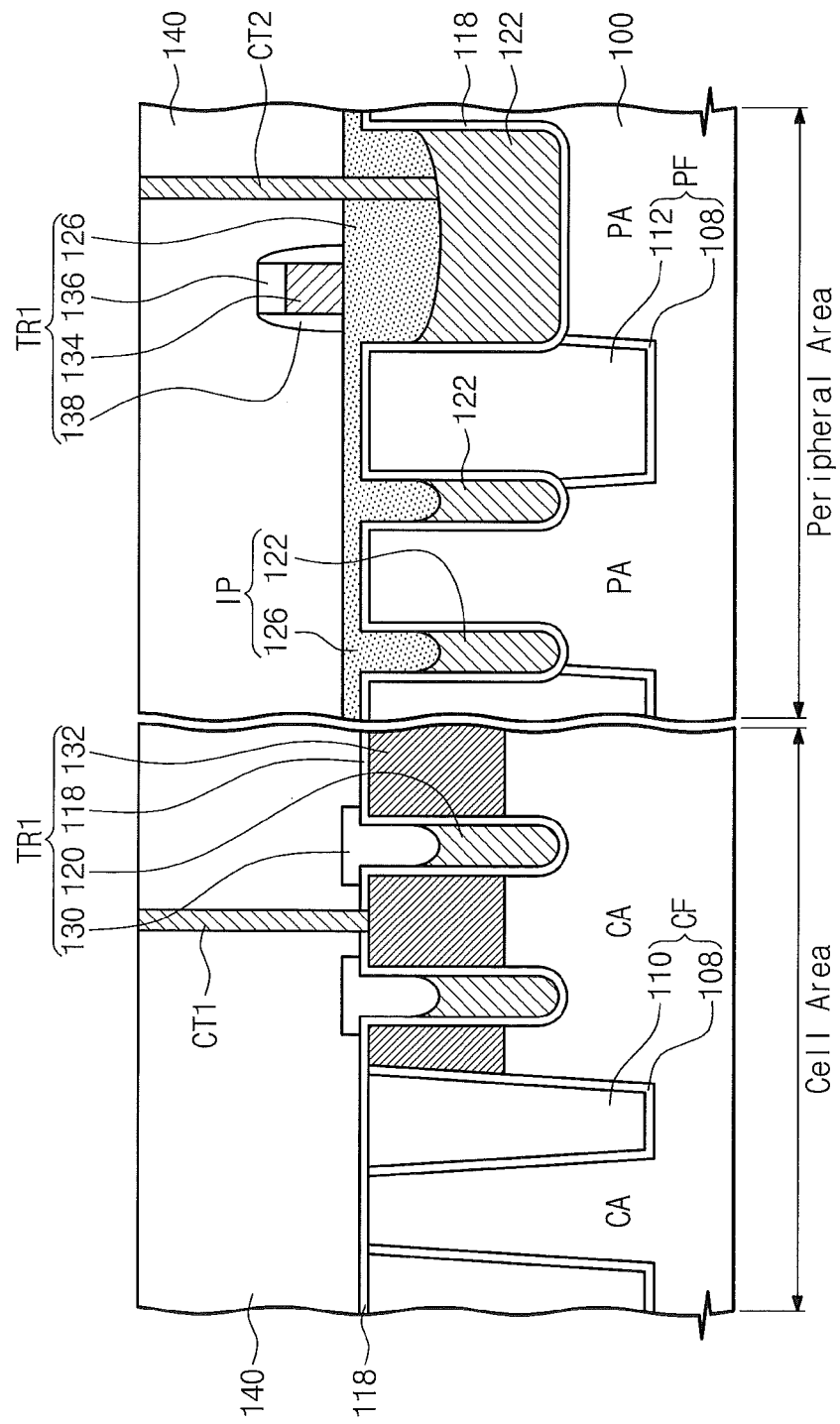

FIGS. 2A through 2N are cross-sectional views illustrating operations for fabricating a semiconductor device according to some embodiments of the inventive subject matter. Referring to FIG. 2A, trenches 104 and 106 are formed in the substrate 100 including the cell area and the peripheral area. The trenches 104 and 106 may include a cell trench 104 formed in the cell area and a peripheral trench 106 formed in the peripheral area.

More specifically, a first mask 102 is formed on the substrate 100. The substrate 100 is etched using the first mask 102 to form the trenches 104 and 106. For example, the trenches 104 and 106 may have a width substantially narrower downwardly due to the nature of the etching, and thus may have an inclined inner sidewall.

Referring to FIG. 2B, the nitride liner 108 is formed conformally on the substrate 100 in which the first mask 102 and the trenches 104 and 106 are formed.

The nitride liner 108 may be continuously formed along the surface profile of the trenches 104 and 106 and the first mask 102 so as not to bury the inside of the trenches 104 and 106. The nitride liner 108 may contain nitride and may be formed by chemical vapor deposition or atomic layer deposition.

There may be removed the first mask 102 and the nitride liner 108 formed along the surface profiler of the first mask 102. Therefore, the nitride liner 108 may be formed conformally in the trenches 104 and 106.

Referring to FIG. 2C, the device isolating patterns 110 and 112 are formed inside the trenches 104 and 106 in which the nitride liner 108 is formed. The device isolating patterns 110 and 112 includes the cell device isolating pattern 110 formed in the cell area and the peripheral device isolating pattern 112 formed in the peripheral area.

More specifically, the device isolating layer may be formed on the substrate 100 to completely fill the trenches 104 and 106. The device isolating layer contains oxide. An example of the oxide includes a silicon oxide. The silicon oxide may contain BSG (Borosilicate Glass), PSG (PhosphoSilicate Glass), BPSG (BoroPhosphoSilicate Glass), PE-TEOS (Plasma Enhanced Tetra Ethyl Ortho Silicate), or HDP (High Density Plasma) oxide, or the like. The device isolating layer may be formed by chemical vapor deposition, low-pressure chemical vapor deposition, plasma-enhanced chemical vapor deposition, or a spin process.

The device isolating patterns 110 and 112 may be formed by polishing the upper portion of the device isolating layer so as to expose the upper surface of the substrate 100. Examples of the polishing process may include chemical mechanical polishing and etch back.

The device isolating patterns 110 and 112 and the nitride liner 108 may function as the field patterns CF and PF defining the active patterns CA and PA in the substrate 100. The active patterns CA and PA include the cell active pattern CA formed in the cell area and the peripheral active pattern PA formed in the peripheral area. According to some embodiments of the inventive subject matter, the active patterns may be generally linear and extend in the first direction.

Referring to FIG. 2D, recesses (trenches) 114 and 116 are formed in the substrate 100. The recesses 114 and 116 include the cell recess 114 formed in the cell area and the peripheral recess 116 formed in the peripheral area.

The cell recess 114 may extend in the second direction substantially different from the first direction. The peripheral recess 116 may extend in the first direction. For example, the second direction may be perpendicular to the first direction.

According to some embodiments of the inventive subject matter, the peripheral recess 116 may be formed in the boundary region between the peripheral active pattern PA and the peripheral field pattern PF. By forming the peripheral recess 116, a part of the nitride liner 108 of the peripheral field pattern PF may be removed.

By removing the nitride liner 108 in the boundary region between the peripheral active pattern PA and the peripheral field pattern PF, it is possible to reduce deterioration in HEIP characteristics in the p-MOS transistor formed in the subsequent process.

Referring to FIG. 2E, a first oxide layer 118 is conformally formed on the substrate 100 in which the cell recess 114 and the peripheral recess 116 are formed.

The first oxide layer 118 may be continuously formed along the surface profile of the substrate 100 in which the cell recess 114 and the peripheral recess 116 are formed. Moreover, the first oxide layer 118 may be formed so as not to fill the cell recess 114 and the peripheral recess 116.

The first oxide layer 118 may contain silicon oxide. The first oxide layer 118 may be formed by thermal oxidation or chemical vapor deposition.

According to some embodiments of the inventive subject matter, the first oxide layer 118 formed in the cell recess 114 may function as the first gate insulating layer 118 of the first transistor TR1 formed in a subsequent process.

Referring to FIG. 2F, a first conductive pattern 120 and a second conductive pattern 122 are formed in the lower portion of the cell recess 114 and the lower portion of the peripheral recess 116, respectively.

The first conductive pattern 120 and the second conductive pattern 122 may be formed so as not to completely fill the cell recess 114 and the peripheral recess 116, respectively. The upper portion of the cell recess 114 and the upper portion of the peripheral recess 116 may be opened.

The first conductive pattern 120 may extend in the second direction. The second conductive pattern 122 may extend in the first direction.

The first conductive pattern 120 and the second conductive pattern 122 may contain silicon doped with impurities, metal, or metal compound. According to some embodiments of the inventive subject matter, the first conductive pattern 120 may function as the first gate electrode 120 of the first transistor TR1 completed in the subsequent process. For example, the first transistor TR1 may be an n-MOS transistor. In this case, the first conductive pattern 120 may contain a material capable of functioning as the gate electrode of the n-MOS transistor.

The second conductive pattern 122 may function as the lower portion of the insertion pattern IP (see FIG. 2I) capable of applying a predetermined voltage to adjust the electric characteristics of the semiconductor device. The applied voltage is varied depending on the material contained in the second conductive pattern 122. By using the applied voltage, it is possible to improve the electric characteristics of the semiconductor device.

For example, the first conductive pattern 120 and the second conductive pattern 122 may contain silicon doped with n-type impurities. In some embodiments, the first conductive pattern 120 may contain silicon doped with n-type impurities and the second conductive pattern 122 may contain silicon doped with p-type impurities. In some embodiments, the first conductive pattern 120 and the second conductive pattern 122 may contain metal or metal compound.

Referring to FIG. 2G, a nitride layer 124 may be formed on the cell area of the substrate 100.

The nitride layer 124 may be formed on the cell area and the peripheral area to fill the recesses 114 and 116 of the cell area and the peripheral area. The nitride layer 124 may contain silicon nitride. The nitride layer 124 may be formed by chemical vapor deposition or an atomic layer laminating process.

Referring to FIG. 2H, the nitride layer 124 formed in the upper portion of the peripheral recess 116 may be removed.

More specifically, the cell area of the substrate 100 may be masked. The cell area of the substrate 100 may be masked with a photoresist pattern. The nitride layer 124 formed in the peripheral area may be removed. Therefore, the upper portion of the peripheral recess 116 may be opened.

Referring to FIG. 2I, a second oxide layer 126 may be formed in the peripheral area so as to fill the peripheral recess 116 of the substrate 100.

The second oxide layer 126 may contain silicon oxide. The second oxide layer 126 may be formed by chemical vapor deposition or an atomic layer laminating process.

The second oxide layer 126 formed in the peripheral area may include a lower portion filling the upper portion of the peripheral recess 116 and an upper portion formed on the substrate 100. The lower portion of the second oxide layer 126 may function as the upper portion of the insertion pattern IP. The upper portion of the second oxide layer 126 may function as the second gate insulating layer 126 of the second transistor TR2 completed in a subsequent process.

The insertion pattern IP includes the lower portion 122 containing a conductive material and the upper portion 126 containing an oxide. In other words, the insertion pattern IP may include the second conductive pattern 122 and the second oxide layer 126.

Referring to FIG. 2J, a second mask 128 may be formed on the nitride layer 124 of the cell area and the second oxide layer 126 of the peripheral area.

The second mask 128 on the nitride layer 124 of the cell area may extend in substantially the same direction as that of the first conductive pattern 120. The second mask 128 on the second oxide layer 126 of the peripheral area may mask the entire peripheral area.

Referring to FIG. 2K, etching may be performed using the second mask 128 to form the nitride pattern 130 in the cell area.

The nitride pattern 130 may extend on the first conductive pattern 120 in the second direction. The nitride pattern 130 and the first conductive pattern 120 may extend in substantially the same direction.

The nitride pattern 130 may include a lower portion filling the upper portion of the cell recess 114 and an upper portion protruding toward the surface of the substrate 100. For example, the lower portion of the nitride pattern 130 may have substantially the same width as that of the first conductive pattern 120. The upper portion of the nitride pattern 130 may have a width substantially greater than that of the first conductive pattern 120. In some embodiments, the lower portion and the upper portion of the nitride pattern 130 have substantially the same width as the first conductive pattern 120.

By implanting impurities into the substrate 100 of both the nitride pattern 130 and the first conductive pattern 120, the first source/drain region 132 is formed. According to some embodiments of the inventive subject matter, the first source/drain region 132 may contain n-type impurities.

The first transistor TR1 may be formed in the cell area. The first transistor TR1 may include the first oxide layer 118, the first conductive pattern 120, the nitride pattern 130, and the first source/drain region 132. The first oxide layer 118 formed in the cell area may function as the first gate insulating layer 118 and the first conductive pattern 120 may function as the first gate electrode 120. The first transistor TR1 may be an n-MOS transistor. The first transistor TR1 may further include the first channel region CR1 buried in the substrate 100. The transistor including the channel region buried in the substrate 100 is referred to as a buried channel array transistor (BCAT).

In the embodiments of the inventive subject matter, the buried channel array transistor is described as the first transistor TR1. However, the inventive subject matter is not limited to this structure of the first transistor TR1.

Referring to FIG. 2L, a third conductive pattern 136 may be formed on the second oxide layer 126 formed in the peripheral area of the substrate 100.

More specifically, a first conductive layer (not illustrated) and a third mask 134 are sequentially formed in the peripheral area where the second oxide layer 126 is formed. The first conductive layer may contain silicon doped with impurities, metal, or metal compound. For example, the first conductive layer may contain silicon doped with p-type impurities. The third mask 134 may contain nitride such as silicon nitride. The first conductive layer may be etched using the third mask 134 to form the third conductive pattern 136.

The third conductive pattern 136 may function as the second gate electrode 136 of the second transistor TR2 completed later. The third conductive pattern 136 may be generally linear and extend in the second direction.

A second source/drain region (not illustrated) may be formed by implanting p-type impurities into the substrate 100 of both sides of the third conductive pattern 136.

The second transistor TR2 may be formed in the peripheral area. The second transistor TR2 may include the second oxide layer 126, the third conductive pattern 136, and the second source/drain region. The second oxide layer 126 formed in the peripheral area may function as the second gate insulating layer 126. The third conductive pattern 136 may function as the second gate electrode. The second transistor TR2 may further include a spacer 138. The second transistor TR2 may be a p-MOS transistor. The second transistor TR2 may further include a second channel region formed in the surface of the substrate 100. However, the inventive subject matter is not limited to this structure of the second transistor TR2.

Referring to FIG. 2M, an inter-layer insulating layer 140 may be formed on the substrate 100 to cover the first transistor TR1 and the second transistor TR2.

The inter-layer insulating layer 140 may contain oxide such as silicon oxide, nitride such as silicon nitride, or oxynitride such as silicon oxynitride. The silicon oxide may contain BSG, PSG, BPSG, PE-TEOS, or HDP oxide, or the like.

After the inter-layer insulating layer 140 is formed, the upper portion of the inter-layer insulating layer 140 may be subjected to planarization. Examples of the planarization include chemical mechanical polishing and etch back.

Referring to FIG. 2N, the first contact CT1 and the second contact CT2 may be formed in the substrate 100.

The first contact CT1 may be formed in the cell area of the substrate 100 so as to be formed through the inter-layer insulating layer 140 and be electrically connected to the first source/drain region 132. The first contact CT1 may electrically connect a bit line (not illustrated) or a capacitor (not illustrated) to the first source/drain region 132. Although not illustrated, the first contact CT1 may be formed in the peripheral area of the substrate 100 so as to be formed through the inter-layer insulating layer 140 and be electrically connected to the second source/drain region.

The second contact CT2 may be formed in the peripheral area of the substrate 100 so as to be formed through the inter-layer insulating layer 140 and the second oxide layer 126 and be electrically connected to the lower portion of the insertion pattern IP, that is, one side of the second conductive pattern 122.

More specifically, a fourth mask (not illustrated) may be formed on the inter-layer insulating layer 140. The inter-layer insulating layer 140 and/or the second oxide layer 126 are etched using the fourth mask to form a first contact hole (not illustrated) and a second contact hole (not illustrated), respectively. The first contact hole may expose the upper portion of the first source/drain region 132. The second contact hole may expose the upper portion of the second conductive pattern 122 by sequentially etching the inter-layer insulating layer 140 and the second oxide layer 126 in the peripheral area of the second contact hole. A second conductive layer (not illustrated) may be formed on the inter-layer insulating layer 140 to completely fill the first and second contact holes. The second conducive layer may contain silicon doped with impurities, metal, or metal compound.

The first contact CT1 may further be expanded. For example, the size of the first contact CT1 may be expanded in the second direction. Therefore, the electric contact area of the first contact CT1 is increased, thereby improving the electric reliability of the semiconductor device.

The second contact CT2 may be electrically connected to the lower portion of the insertion pattern IP. Therefore, a voltage of an appropriate range may be applied to the second contact CT2 depending on the conductive material contained in the lower portion of the insertion pattern IP. By using the applied voltage, it is possible to improve the electric characteristics of the semiconductor device.

Second Embodiments

Figure 3A:
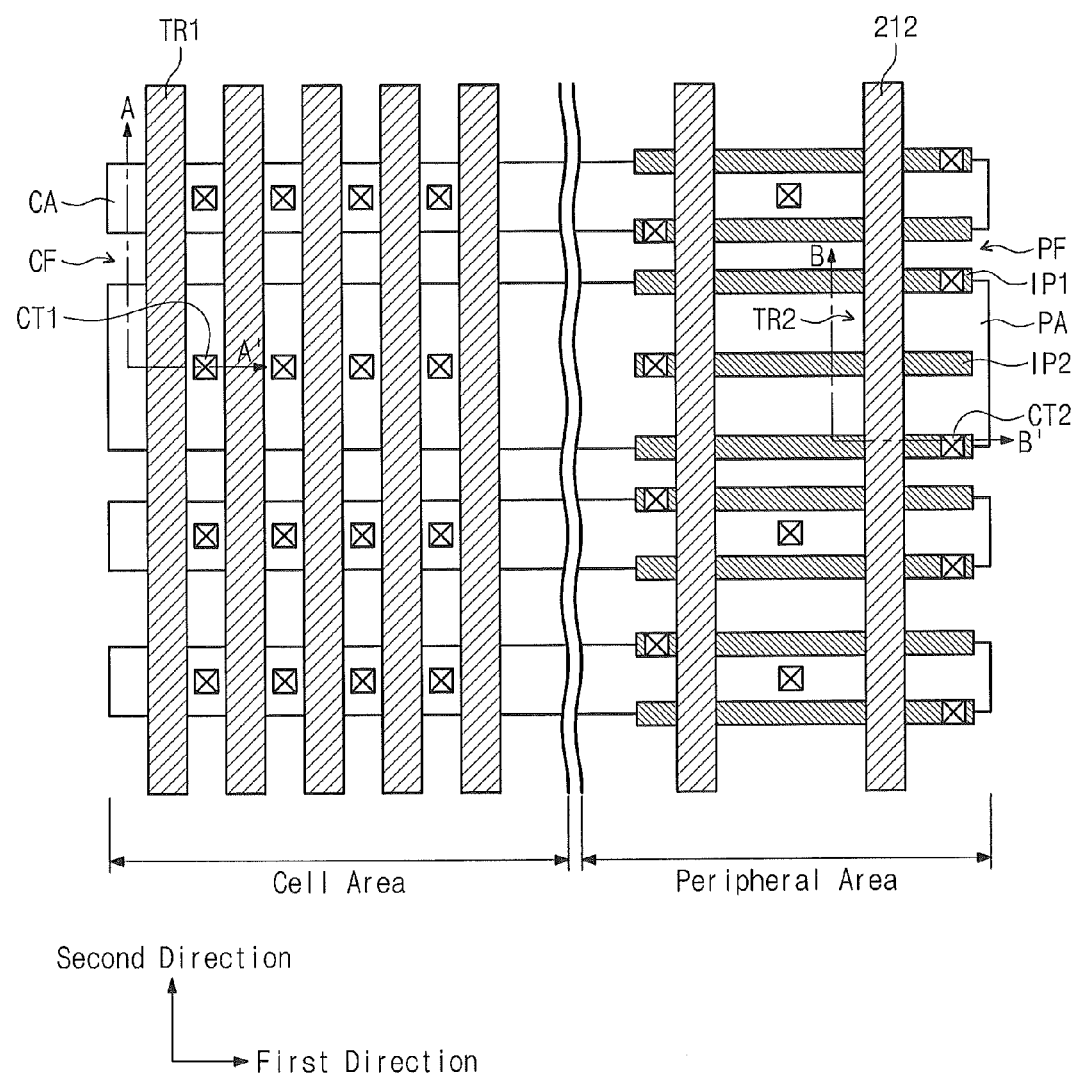
FIG. 3A is a plan view illustrating a semiconductor device according to further embodiments of the inventive subject matter.
Figure 3B:
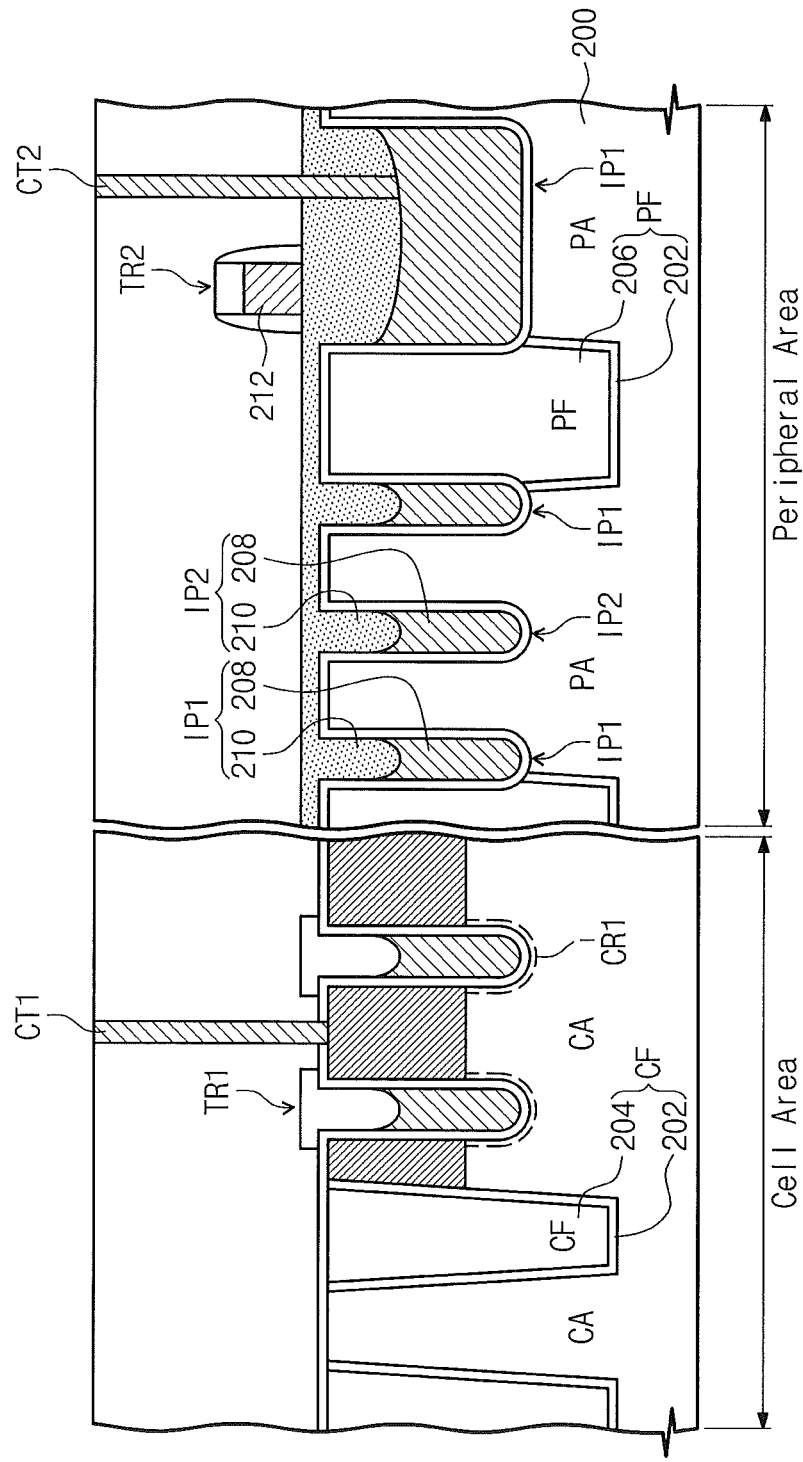
FIG. 3B is a cross-sectional view taken along the lines A-A' and B-B' of FIG. 3A.

FIG. 3A is a plan view illustrating a semiconductor device according to some embodiments of the inventive subject matter. FIG. 3B is a cross-sectional view illustrating the semiconductor device taken along the lines A-A' and B-B' of FIG. 3A. The left part of FIG. 3B is the cross-sectional view illustrating the semiconductor device taken along the line A-A' of FIG. 3A. The right part of FIG. 3B is the cross-sectional view illustrating the semiconductor device taken along the line B-B' of FIG. 3A.

Referring to FIGS. 3A and 3B, the semiconductor device may include field patterns CF and PF in respective trenches 204 and 206, active patterns CA and PA, a first transistor TR1, a second transistor TR2, a first insertion pattern IP1, a second insertion pattern IP2, a first contact CT1, and a second contact CT2 formed in a substrate 200.

The first insertion pattern IP1 and the second insertion pattern IP2 may be formed in the peripheral area. The first insertion pattern IP1 and the second insertion pattern IP2 may each be generally linear and extend in the first direction, and may be formed in parallel.

The first insertion pattern IP1 and the second insertion pattern IP2 may each have a structure buried downwardly from the surface of the substrate. The first insertion pattern IP1 and the second insertion pattern IP2 may each include a lower portion 208 containing a conductive material and an upper portion 210 containing an oxide. An example of the oxide includes silicon oxide. Examples of the conductive material include silicon doped with impurities, metal, and metal compound. For example, the lower portions 208 of the first insertion pattern IP1 and the second insertion pattern IP2 may contain silicon containing n-type impurities. In some embodiments, the lower portions 208 of the first insertion pattern IP1 and the second insertion pattern IP2 may contain silicon containing p-type impurities. In some embodiments, the lower portions 208 of the first insertion pattern IP1 and the second insertion pattern IP2 may contain metal or metal compound.

The first insertion pattern IP1 may be formed in the boundary region between the peripheral active pattern PA and the peripheral field pattern PF. One side and other side of the first insertion pattern IP1 may come into contact with the device isolating pattern of the peripheral field pattern PF and the peripheral active pattern PF, respectively. No nitride liner 202 may be formed in the region where the first insertion pattern IP1 is formed.

By forming no nitride liner 202 in the boundary region between the peripheral active pattern PA and the peripheral field pattern PF where the first insertion pattern IP1 is formed, it is possible to reduce deterioration HEIP characteristics in the p-MOS transistor.

The second insertion pattern IP2 may intersect the peripheral active pattern PA. For example, the second insertion pattern IP2 may be formed through the central portion of the peripheral active pattern PA. In this case, since the upper portion of the second insertion pattern IP2 contains oxide, the second insertion pattern IP2 may partially isolate the second gate electrode 212 extending on the second insertion pattern IP2. The second gate electrode 212 may be isolated effectively, as necessary, without performing a predetermined device isolating process.

According to some embodiments of the inventive subject matter, the second insertion pattern IP2 may be formed during forming the first insertion pattern IP1.

Since the field patterns CF and PF, the active patterns CA and PA, the first transistor TR1, the second transistor TR2, the first contact CT1, and the second contact CT2 according to this embodiment of the inventive subject matter are substantially the same as those described with reference to FIGS. 1A and 1B in the first embodiment of the inventive subject matter, the detailed description thereof is omitted.

Third Embodiments

Figure 4A:
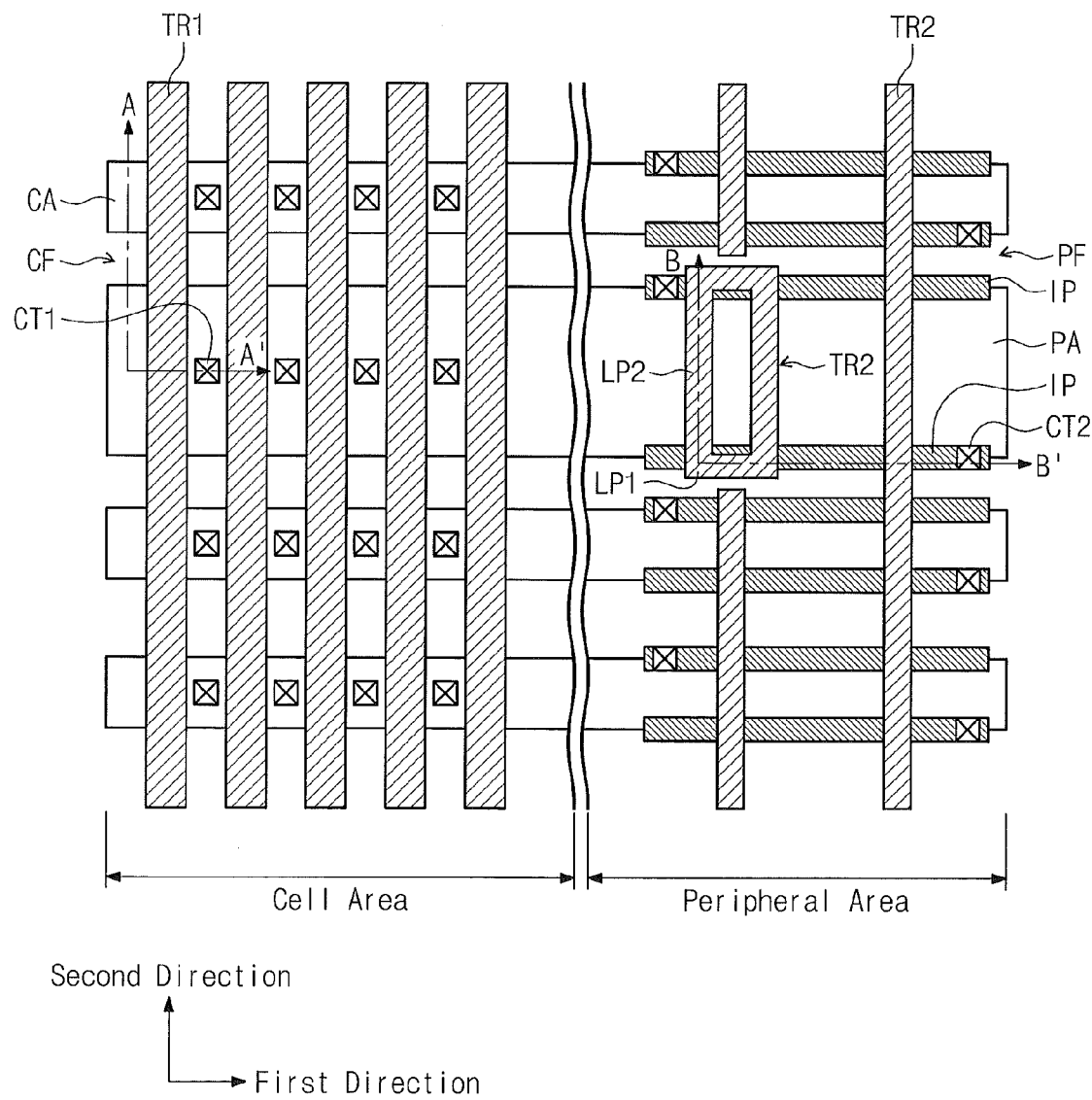
FIG. 4A is a plan view illustrating a semiconductor device according to further embodiments of the inventive subject matter.
Figure 4B:
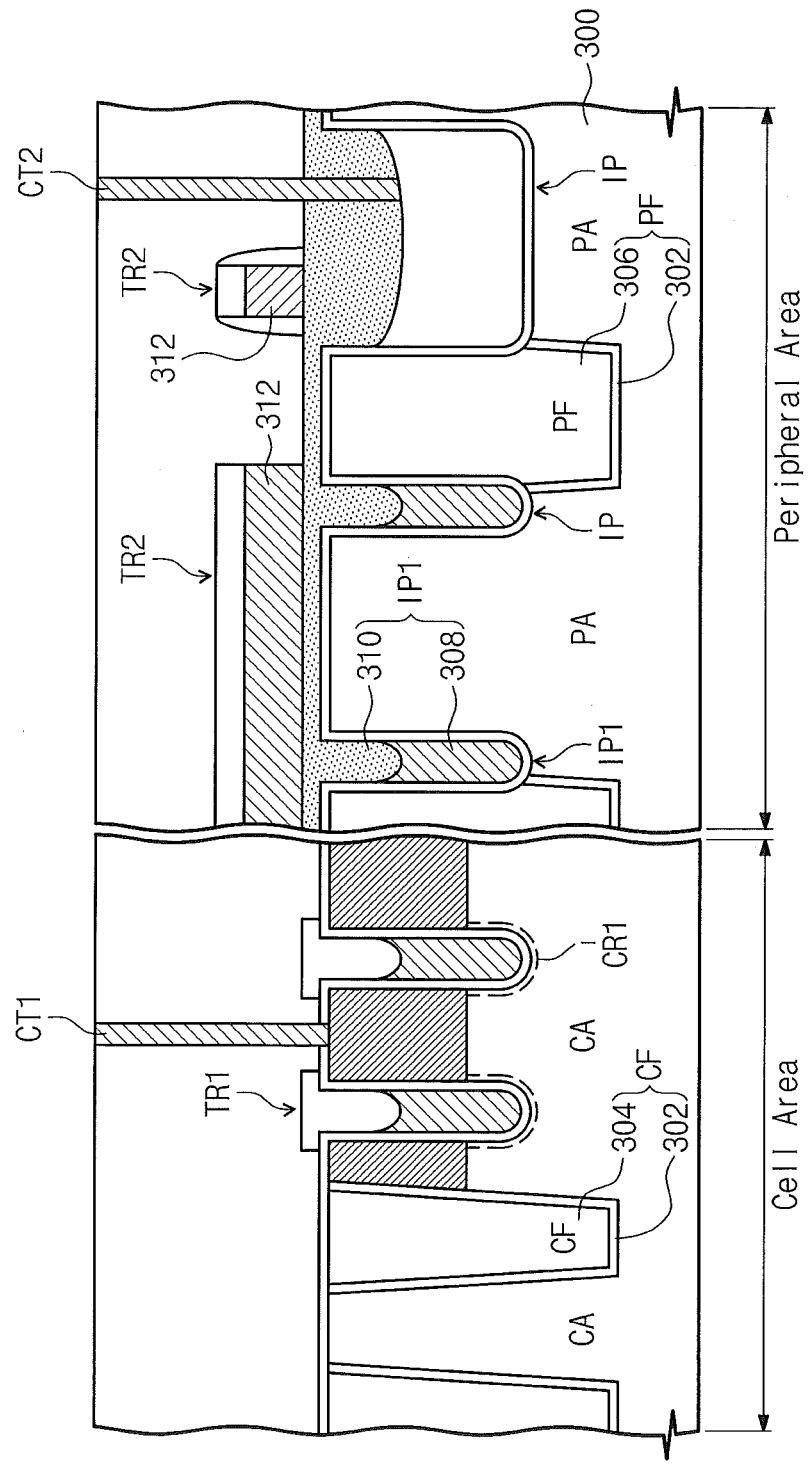
FIG. 4B is a cross-sectional view taken along the lines A-A' and B-B' of FIG. 4A.

FIG. 4A is a plan view illustrating a semiconductor device according to further embodiments of the inventive subject matter. FIG. 4B is a cross-sectional view taken along the lines A-A' and B-B' of FIG. 4A. The left part of FIG. 4B is the cross-sectional view illustrating the semiconductor device taken along the line A-A' of FIG. 4A. The right part of FIG. 4B is the cross-sectional view illustrating the semiconductor device taken along the line B-B' of FIG. 4A.

Referring to FIGS. 4A and 4B, the semiconductor device may include field patterns CF and PF on a nitride liner 302 in respective trenches 304 and 306, active patterns CA and PA, a first transistor TR1, a second transistor TR2, an insertion pattern IP1 including a lower portion 308 and an upper portion 310, a first contact CT1, and a second contact CT2 formed in a substrate 300.

A second gate electrode 312 of the second transistor TR2 may have a square ring shape. More specifically, the second gate electrode 312 may include first line patterns LP1 facing each other and second line patterns LP2 facing each other. The first line patterns LP1 may extend in the first direction. The second line patterns LP2 may extend in the second direction. The extension length of the second line patterns LP2 may be substantially longer than that of the first line patterns LP1. For example, the second gate electrode 312 with the square ring shape is applicable to a sub-word line driver (SWD).

The second transistor TR2 may further include a second gate electrode 312 which is generally linear and extends in one direction. The second gate electrode 312 of the line type may be formed together with the second gate electrode 312 with the square ring shape.

Since the field patterns CF and PF, the active patterns CA and PA, the first transistor FR1, the insertion pattern IP, the first contact CT1, and the second contact CT2 according to this embodiment of the inventive subject matter are substantially the same as those described with reference to FIGS. 1A and 1B in the first embodiment of the inventive subject matter, the detailed description thereof is omitted.

Fourth Embodiments

Figure 5A:
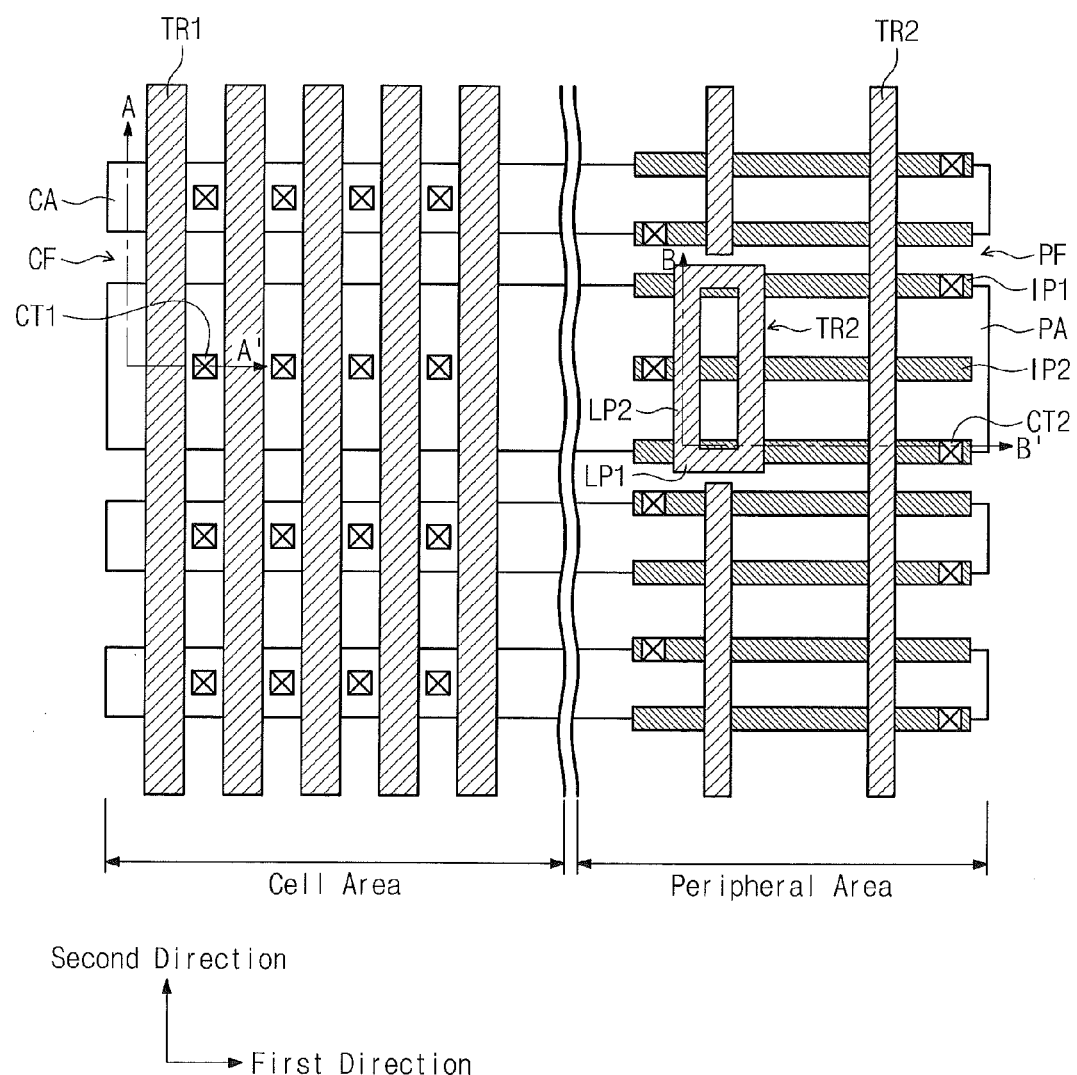
FIG. 5A is a plan view illustrating a semiconductor device according to further embodiments of the inventive subject matter.
Figure 5B:
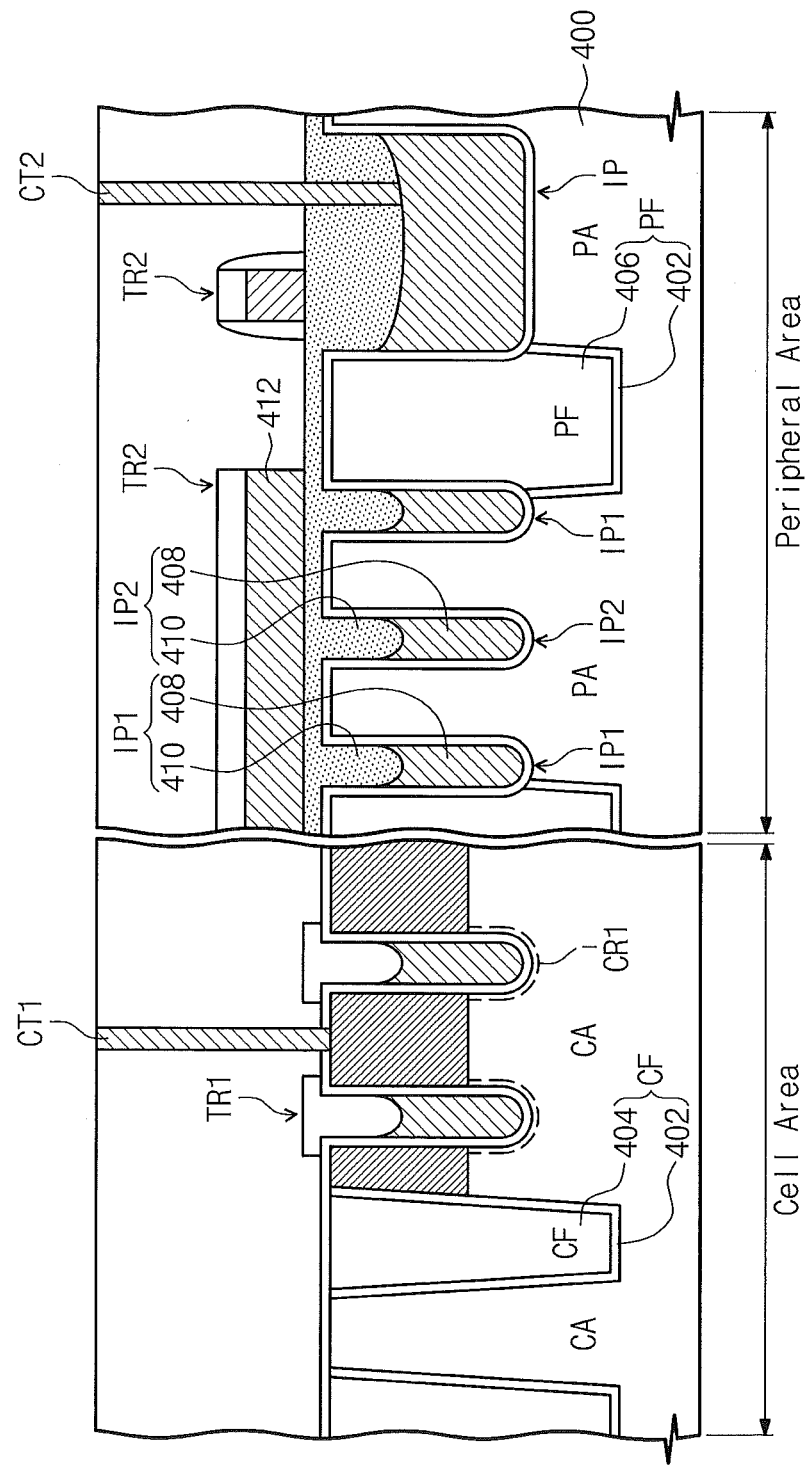
FIG. 5B is a cross-sectional view taken along the lines A-A' and B-B' of FIG. 5A.

FIG. 5A is a plan view illustrating a semiconductor device according to further embodiments of the inventive subject matter. FIG. 5B is a cross-sectional view taken along the lines A-A' and B-B' of FIG. 5A. The left part of FIG. 5B is the cross-sectional view illustrating the semiconductor device taken along the line A-A' of FIG. 5A. The right part of FIG. 5B is the cross-sectional view illustrating the semiconductor device taken along the line B-B' of FIG. 5A.

Referring to FIGS. 5A and 5B, the semiconductor device may include field patterns CF and PF on a nitride liner 402 in respective trenches 404 and 406, active patterns CA and PA, a first transistor TR1, a second transistor TR2, a first insertion pattern IP1 and a second insertion pattern IP2 including lower portions 408 and upper portions 410, a first contact CT1, and a second contact CT2 formed in a substrate 400.

The first insertion pattern IP1 and the second insertion pattern IP2 may be formed in the peripheral area. The first insertion pattern IP1 and the second insertion pattern IP2 may be generally linear and extend in the first direction and may be formed in parallel to each other so as to be distant from each other at a predetermined interval.

Since the first insertion pattern IP1 and the second insertion pattern IP2 are substantially the same as those with reference to FIGS. 3A and 3B in the second embodiment of the inventive subject matter, the detailed description thereof is omitted.

A second gate electrode 412 of the second transistor TR2 may have a square ring shape. Since the second transistor is substantially the same as that described with reference to FIGS. 4A and 4B in the third embodiment of the inventive subject matter, the detailed description of the second transistor is omitted.

Since the field patterns CF and PF, the active patterns CA and PA, the first transistor TR1, the first insertion pattern IP1, the first contact CT1, and the second contact CT2 according to this embodiment of the inventive subject matter are substantially the same as those described with reference to FIGS. 1A and 1B in the first embodiment of the inventive subject matter, the detailed description thereof is omitted.

Example

Figure 6A:
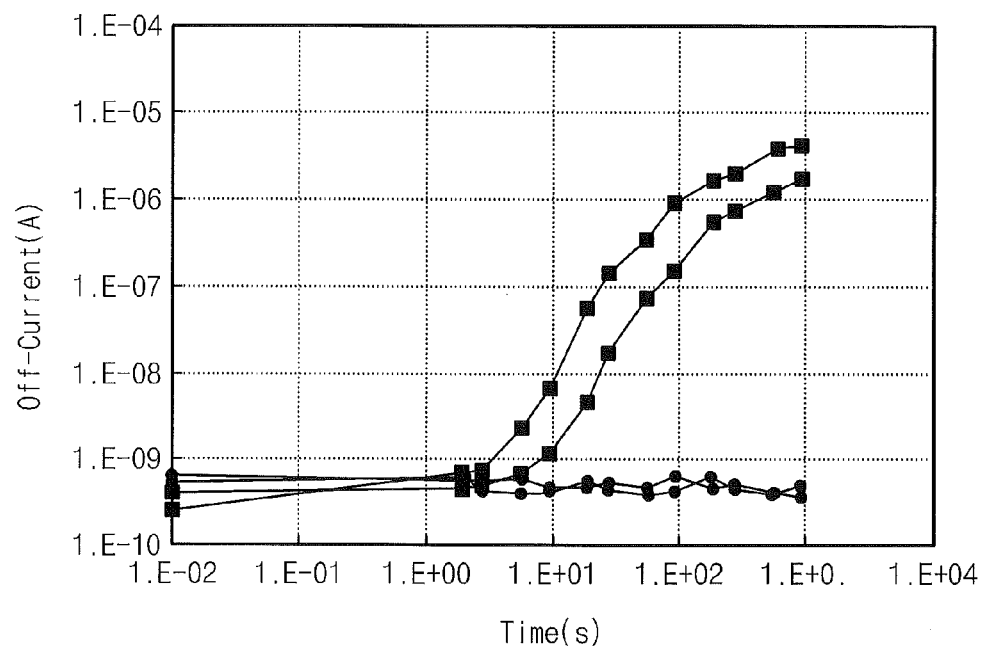
FIGS. 6A and 6B are graphs showing correlation between the thickness of a nitride liner and the characteristics of the off-current.
Figure 6B:
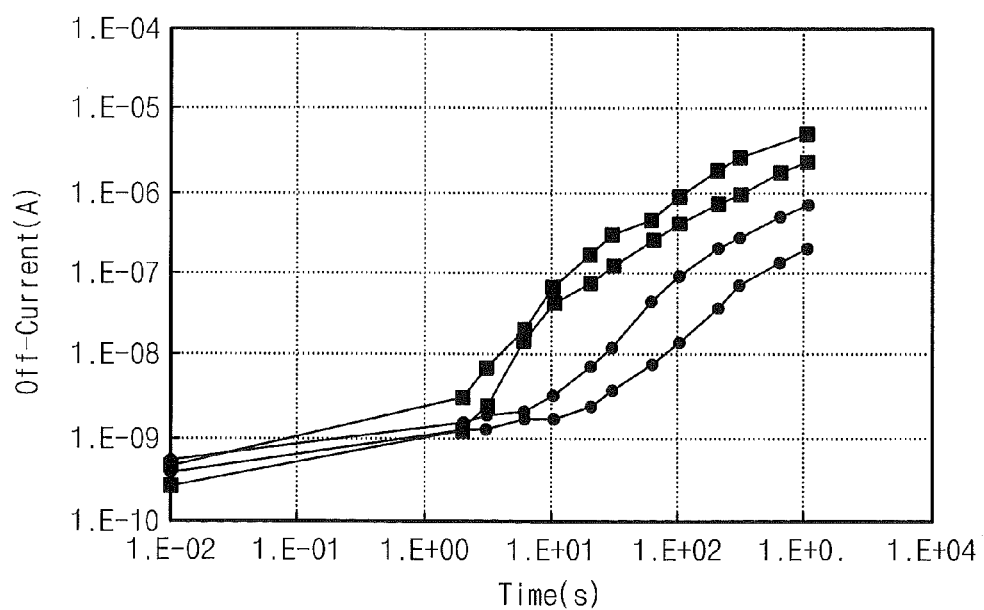

FIGS. 6A and 6B are graphs showing correlation between the thickness of a nitride liner and the characteristics of the off-current.

The X-axis in FIGS. 6A and 6B represents time and the unit is second (S). The Y-axis represents off-current ($I_{off}$) and the unit is ampere (Å).

Since the nitride of the nitride liner has a feature trapping electrons, the electrons are trapped in the boundary surface between the nitride liner (nitride) and the device isolating pattern (oxide). Therefore, by the trapped electrons, holes are focused in the region in the substrate outside the device isolating pattern. This phenomenon is called HEIP (Hot Electron Induced Punch-through). This HEIP phenomenon may particularly occur in a p-MOS transistor in which holes are major carriers and high $V_{pp}$ (peak to peak voltage) is applied. In particular, the characteristics of the off-current may deteriorate. That is, by detecting the characteristics of the off-current, it is possible to confirm the deterioration in the characteristics of HEIP.

A stress is applied to the p-MOS transistor by applying a voltage of −4.8 V to the drain region of the p-MOS transistor and applying a voltage of −1.5 V to the gate electrode of the p-MOS transistor for 1,000 seconds.

The off-current is measured with time by applying a voltage of 0 V to the gate electrode of the p-MOS transistor to which the stress is applied and by applying a voltage of −3 V to the drain region of the p-MOS transistor.

In FIG. 6A, dots (-●-) show a case in which the nitride liner is completely removed in the boundary region between the device isolating pattern and the nitride liner, and squares (-■-) show a case where the nitride liner is not removed in the boundary region between the device isolating pattern and the nitride liner.

In FIG. 6B, the dots (-●-) show a case where the nitride liner is partially removed in the boundary region between the device isolating pattern and the nitride liner, and squares (-■-) show a case where the nitride liner is not removed in the boundary region between the active pattern and the field pattern. The thickness of the nitride liner removed in the case of the dots (-●-) is about 500 Å.

It can be known that the characteristics of the off-current are improved even in the case where the nitride liner is partially removed. However, it can be known that the off-current characteristics are considerably improved when the nitride liner is completely removed. Therefore, by removing the nitride liner partially or completely, it is possible to reduce deterioration of HEIP characteristics.

Applied Examples

Figure 7A:
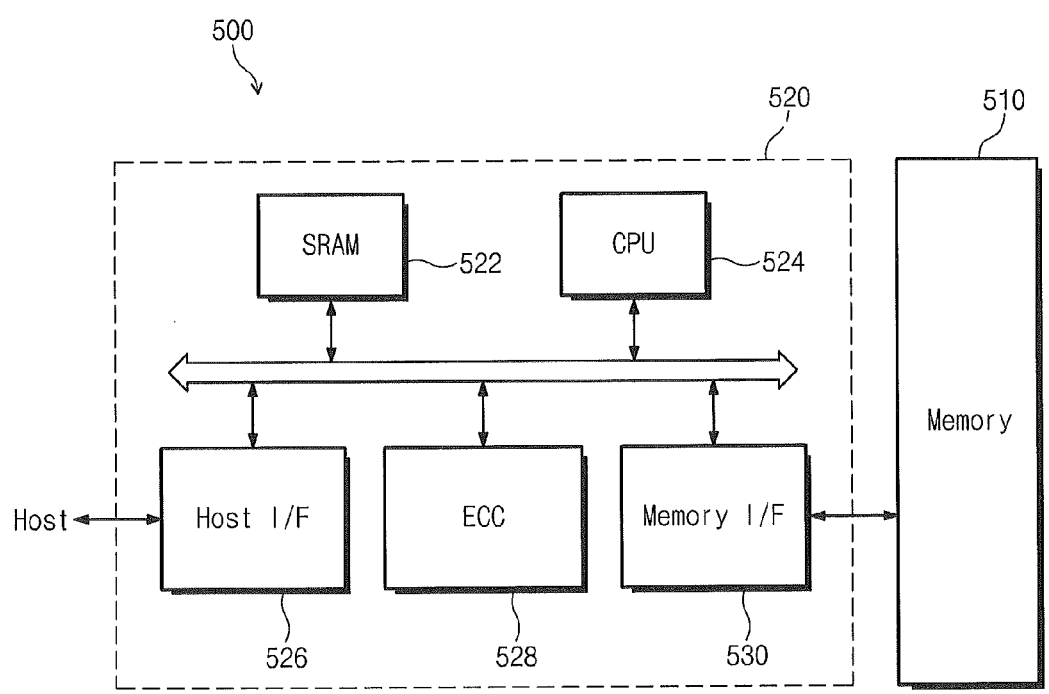
FIG. 7A is a block diagram illustrating a memory card including the semiconductor device according to some embodiments of the inventive subject matter; and
}

FIG. 7A is a block diagram illustrating a memory card including the semiconductor device according to some embodiments of the inventive subject matter.

Referring to FIG. 7A, the semiconductor device according to the above-described embodiments of the inventive subject matter is applicable to a memory card. For example, a memory card 500 may include a memory controller 520 controlling general data exchange between a host and a memory 510. An SRAM 522 may be used a work memory of a central processing unit 524. A host interface 526 may have a data exchange protocol of the host connected to the memory card 500. An error correction code 528 may detect and correct errors contained in data read from the memory 510. A memory interface 530 interfaces with the memory 510. The central processing unit 524 executes general control operation to exchange data of the memory controller 520.

When the memory 510 applied to the memory card 500 includes the semiconductor device According to some embodiments of the inventive subject matter, it is possible to suppress the deterioration in the characteristics of HEIP without expanding the gate electrode with a tap structure or the like. Moreover, since the electric contact area to the source/drain region is increased, it is possible to improve the electric reliability of the semiconductor device. By applying a voltage of an appropriate range to the lower portion of the insertion pattern, it is also possible to improve the characteristics of the semiconductor device. Moreover, since the gate electrode is isolated by the upper portion of the insertion pattern, as necessary, it is possible to use the semiconductor device more effectively.

Figure 7B:
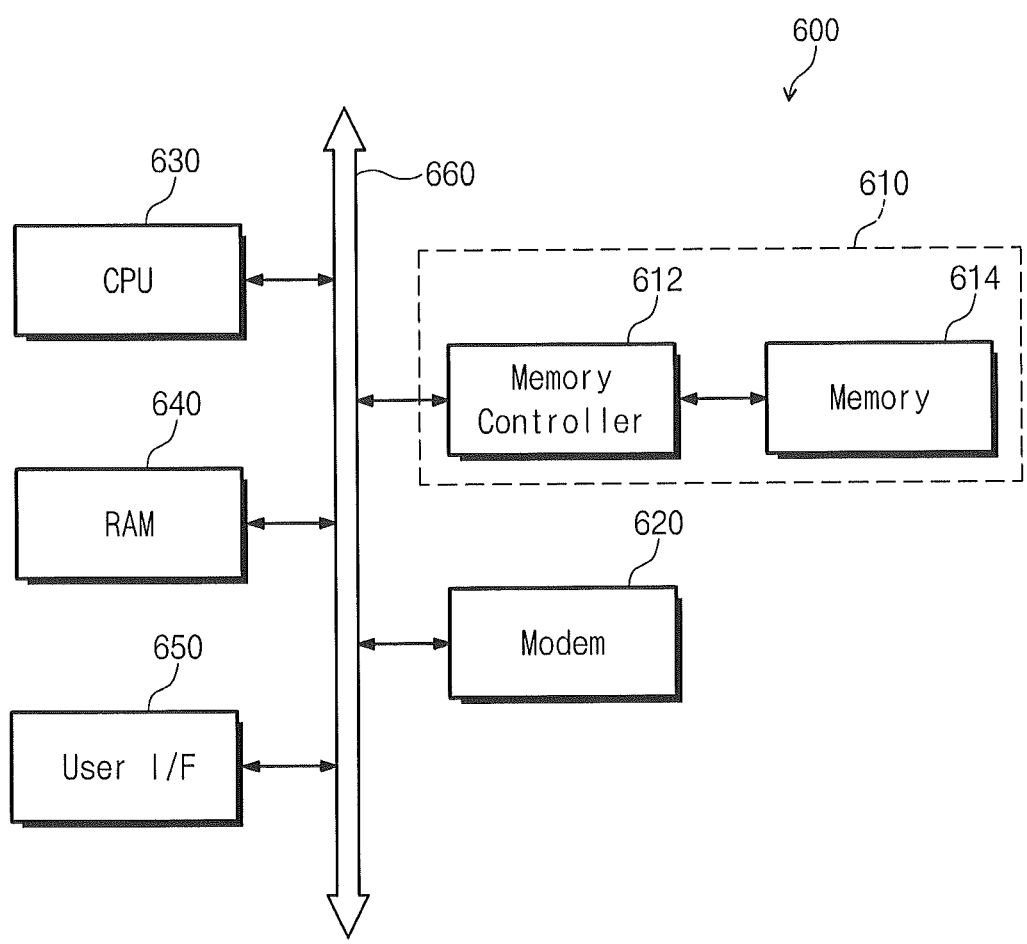
FIG. 7B is a block diagram illustrating an information processing system to which a variable resistance memory device is applied according to some embodiments of the inventive subject matter.

FIG. 7B is a block diagram illustrating an information processing system to which a variable resistance memory device is applied according to some embodiments of the inventive subject matter.

Referring to FIG. 7B, an information processing system 600 may include the semiconductor device According to some embodiments of the inventive subject matter, such as a memory system 610 including a DRAM memory. Examples of the information processing system 600 include a mobile apparatus and a computer. For example, the information processing system 600 may include the memory system 610, a modem 620, a central processing unit 630, a RAM 640, a user interface 650 electrically connected to a system bus 660. The memory system 610 may store data processed in the central processing unit 630 or data input from the outside. The memory system 610 may include a memory 612 and a memory controller 614. The memory system 610 may have substantially the same configuration as that of the memory card 500 described with reference to FIG. 7A. The information processing system 600 may be provided as a memory card, a semiconductor disk device (solid state disk), a camera image sensor, or another application chipset. For example, the memory system 610 may be configured by the semiconductor disk device (SSD). In this case, the information processing system 600 store large data in the memory system 610 stably and reliably.

According to some embodiments of the inventive subject matter, by forming the insertion pattern in which the nitride liner adjacent to the gate electrode is removed without expanding the gate electrode of the p-MOS transistor, it is possible to suppress the deterioration in the characteristics of HEIP. Since the size of the contacts electrically connected to the source/drain regions can be increased without expanding the gate electrode, it is possible to improve the electric reliability. Moreover, since the upper portion of the insertion pattern is formed of an oxide, the gate electrode can be isolated, as necessary. The lower portion of the insertion pattern is formed of a conductive material. Therefore, by applying an appropriate voltage to the lower portion of the insertion pattern, it is possible to improve the electric characteristics of the semiconductor device.

Although the present inventive subject matter has been described in connection with the embodiment of the present inventive subject matter illustrated in the accompanying drawings, it is not limited thereto. It will be apparent to those skilled in the art that various substitution, modifications and changes may be thereto without departing from the scope and spirit of the inventive subject matter. Therefore, the above-described embodiments are to be considered illustrative and not restrictive.

What is claimed is:

1. A semiconductor device comprising:
    a substrate comprising a memory cell region and a peripheral region;
    a field pattern comprising an insulating region disposed on a nitride liner in a trench in the substrate adjacent an active region, the field pattern and the active region extending in parallel through the cell and peripheral regions;
    a transistor having a gate electrode on the active region in the peripheral region; and
    an insertion pattern comprising an elongate conductive region disposed in the substrate and extending along a boundary between the field pattern and the active region in the peripheral region.

2. The semiconductor device of claim 1, wherein the insertion pattern comprises:
    a lower conductive portion; and
    an upper insulating portion.

3. The semiconductor device of claim 1, wherein the nitride liner does not extend between sidewalls of the insertion pattern and the field pattern.

4. The semiconductor device of claim 1, further comprising a contact electrically connected to the conductive region of the insertion pattern.

5. The semiconductor device of claim 4, wherein the gate electrode crosses the active region and the field pattern.

6. The semiconductor device of claim 1:
   wherein the field pattern comprises first and second field patterns comprising respective insulating regions disposed on nitride liners in respective trenches in the substrate and extending in parallel through the cell and peripheral regions;
   wherein the active region is disposed between the first and second field patterns; and
   wherein the insertion pattern comprises first and second insertion patterns, each comprising an elongate conductive region disposed in the substrate and extending along respective first and second boundaries between the active region and second first and second field patterns.

7. The semiconductor device of claim 6, wherein the transistor comprises a square-ring shaped gate electrode comprising opposing first line patterns extending in parallel with the active region and overlying the first and second insertion patterns and second opposing line patterns extending across the active region.

8. The semiconductor device of claim 1, wherein the transistor is a PMOS transistor.

9. The semiconductor device of claim 8, further comprising an NMOS transistor in the cell region and comprising a gate electrode crossing the active region.

* * * * *